United States Patent [19]

Cranston

[11] 3,765,938

[45] Oct. 16, 1973

[54] EXPLOSIVE BONDING OF WORKPIECES

[75] Inventor: Benjamin Howell Cranston, Trenton, N.J.

[73] Assignee: Western Electric Company, Incorporated, New York, N.Y.

[22] Filed: Nov. 26, 1971

[21] Appl. No.: 202,563

Related U.S. Application Data

[60] Division of Ser. No. 68,431, Aug. 31, 1970, Pat. No. 3,727,296, Continuation-in-part of Ser. No. 6,829, Jan. 29, 1970, abandoned.

[52] U.S. Cl. ................ 117/212, 117/231, 29/410.1, 29/628

[51] Int. Cl. ................ B23p 3/09

[58] Field of Search ................ 117/212, 217, 38; 29/421 E, 470.1, 486, 497.5, 590

[56] References Cited

UNITED STATES PATENTS

| | | | |
|---|---|---|---|
| 3,474,520 | 10/1969 | Takizawa et al. | 29/470.1 |
| 3,380,908 | 4/1968 | Ono et al. | 29/470.1 X |
| 3,647,533 | 3/1972 | Hicks | 117/212 |
| 3,684,533 | 8/1972 | Conwicke | 117/227 X |

*Primary Examiner*—Ralph S. Kendall
*Assistant Examiner*—M. W. Ball
*Attorney*—W. M. Kain et al.

[57] ABSTRACT

First workpieces, for example, beam-leaded integrated circuits, and the like, are bonded to second workpieces, for example, metallized ceramic substrates by first depositing a quantity of primary explosive, such as lead azide, onto each beam lead and then detonating the explosive to explosively bond the integrated circuits to the substrate. In another embodiment of the invention, the explosive bonding force is applied through a buffer sheet of plastic or metallic material which protects the surface of the substrate from contamination and which, in addition, dampens the shock of the explosion. In yet another embodiment of the invention, metal conductive paths are explosively bonded directly to a ceramic or glass substrate to form a "printed circuit pattern." The same techniques are used to manufacture resistors, capacitors, inductors, etc.

6 Claims, 32 Drawing Figures

EXPLOSIVE BONDING OF WORKPIECES

This is a divisional of my copending application, Ser. No. 68,431, filed Aug. 31, 1970, now Pat. No. 3,727,296, which is a continuation-in-part of my copending application, Ser. No. 6829, filed Jan. 29, 1970, now abandoned.

BACKGROUND OF THE INVENTION

1. Field of the Invention

Broadly speaking, this invention relates to explosive bonding. More particularly, in a preferred embodiment, this invention relates to a method of explosively bonding a first workpiece to a second workpiece.

2. Description of the Prior Art

In the manufacture of electronic circuitry, the use of discrete electrical components, such as resistors, capacitors, and transistors, is rapidly becoming obsolete. These discrete components are largely being supplanted by the integrated circuit, a small chip of silicon which, by a series of selected masking, etching, and processing steps, can be made to perform all of the functions which may be performed by discrete components when these discrete components are suitably interconnected by conventional or printed wiring to form an operating circuit.

Integrated circuit devices are very small, the dimensions of a typical device being apporximately 0.035 inch × 0.035 inch. While these microscopic dimensions permit a heretofore undreamed of degree of miniaturization, there are other reasons why these devices are made as small as they are, one reason being that the microsopic dimensions significantly improve the operating characteristics of circuits which are fabricated on IC devices. For example, the switching speed of gating circuits and the bandwidth of I.F. amplifiers, are significantly improved by this miniaturization.

Of course, an integrated circuit cannot operate in vacuo, and must be interconnected to other integrated circuits and to the outside world, for example, to power supplies, input/output devices, and the like. Here, however, the microscopic dimensions are a distinct disadvantage.

Because of improved manufacturing techniques and increased yield, the cost of integrated circuits has dropped drastically in the last decade and now, in many instances, the cost of interconnecting an integrated circuit to another integrated circuit or to the outside world exceeds the cost of the device itself, a most undesirable situation.

In one prior art method interconnecting integrated circuit devices, each device is bonded to the header of a multiterminal, transistor-like base. Fine gold wires are then hand bonded, one at a time, from the terminal portions of the integrated circuit to corresponding terminal pins on the transistor-like base, which pins, of course, extend up through the header for this purpose, in a well-known manner. Interconnection of the device to other devices or to the outside world is then made by plugging the base, with the integrated circuit device attached thereto, into a conventional transistor-like socket which is wired to other similar sockets, or to discrete components, by conventional wiring or by printed circuitry.

Because of the extremely small size of IC devices, and the attendant alignment problems attempts to automate this uneconomical hand-bonding process have not proved to be successful. Further, apart from the economics, the use of plug-in integrated circuit devices vitiates many of the highly desirable properties possessed by such devices, for example, the compactness which may be realized and the improved circuit performance which they are capable of yielding.

For these reasons, circuit designers generally prefer to connect integrated circuits directly to an insulating substrate, such as glass or ceramic, upon which a suitable pattern of metallic, for example, aluminum or gold, conductor paths has been laid down. Unfortunately, most existing techniques for laying down metallic conductor paths on glass or ceramic are expensive and time consuming. Examples of these existing techniques include sputtering or vacuum depositing a thin metallic film on the substrate followed by the application of a photoresist over the metallic film so deposited. Next, the photoresist is exposed, through an appropriate mark, and developed and the metal film selectively etched away to leave the desired metallic pattern on the substrate. Finally, the metallic pattern is built up to the desired thickness by the electrolytic or electroless deposition technique in which additional metal is deposited onto the existing metallic pattern. An alternate technique, known in the art, for depositing conductive metallic paths on a substate involves screening a granular suspension of metal particles in a suitable vehicle, such as ethyl cellulose, onto the substrate, in the desired pattern, and then firing the substrate to bind and diffuse the metal granules in the surface of the substrate to thereby create the desired pattern of conductive paths on the substrate. Because of the large number of steps involved, it will be self evident that these prior art techniques are expensive and time consuming.

Returning now to the probelms of bonding the devices themselves, the above-described hand-bonding technique for integrated circuit devices may, of course, be used to connect an integrated circuit device to the terminal land areas of a printed conductor pattern. However, techniques which more readily lend themselves to automation have also been developed.

U.S. Pat. No. 3,425,252, for example, which, issued to M. J. Lepselter on Feb. 4, 1969, describes a semiconductor device including a plurality of beam-lead conductors cantilevered outward from the device. To bond such a beam-leaded device to a substrate, the device is first aligned with respect to the terminal land areas of the substrate and then heat and pressure are applied to each of the beam leads, by means of a suitably shaped bonding tool, to simultaneously and automatically bond the beam leads to the substrate.

Another bonding technique which may be used with beam-lead devices is the compliant bonding technique described in U.S. Pat. application, Ser. No. 651,411 of A. Coucoulas which was filed on July 6, 1967 now U.S. Pat. No. 3,533,155. This application describes a bonding technique wherein heat and pressure are applied by a bonding tool to the beam leads through a compliant medium, such as a sheet of 2024 aluminum. The heat and pressure which is applied causes the aluminum sheet to flow plastically and to transmit the bonding pressure to the beam leads, thereby bonding the beam leads to the substrate.

The above-described techniques successfully permit the simultaneous bonding of all the beam leads of a single device, and, of course, are equally well suited for large area bonding, that is to say, the case where it is desired to simultaneously bond a plurality of beam-leaded devices to a single substrate. However, it is somewhat difficult to align a massive, multi-apertured bonding tool (or a plurality of closely spaced, individual bonding tools) with respect to the integrated circuit devices to be bonded. Yet another problem in large area bonding is that, while it is possible to closely control the dimensions of a given IC device and its alignment with respect to a given set of land areas on a substrate, it is very difficult to control the spacing between this set of land areas and another set of land areas at, say, the other end of the substrate. Since there is thus some uncertainty as to the exact location where each integrated circuit device will be found on the substrate, the use of a massive multi-apertured bonding tool (or a plurality of individual bonding tools) becomes difficult because of the variation in device-to-device spacing from one substrate to another.

Another reason why alternative techniques are desirable for use in large area bonding applications is the fact that it is not possible to manufacture large substrates which are substantially flat over the entire surface area of the substrate. There thus exists a substantial degree of nonparallelism between the substrate (and hence the IC devices to be bonded) and the bonding tool (or tools). This lack of paraellelism may result in bonding pressures being applied to some IC devices which are far in excess of the maximum permitted pressure, resulting in damage to, or the complete destruction of, the affected devices. Similarly, the lack of paraellelism may cause bonding pressures to be applied to other IC devices which are far below the minimum pressures required for satisfactory bonding, resulting in weak or non-existent bonds between the devices and the substrate.

Broadly speaking then, the problem is to find an improved method of bonding a first workpiece to a second workpiece. In particular, an important aspect of this problem is to find a method of simultaneously bonding the microleads of a plurality of integrated circuit devices to the corresponding land areas of a substrate, after the devices have been aligned with respect to the substrate, without using a bonding tool which must itself be aligned with respect to the devices and/or the substrate or which must be provided with a complicated compensating mechanism to compensate for lack of parellelism between the substrate and the bonding tool.

A second important aspect of this problem is to find a method of forming metallic conductive paths or regions on an insulating substrate, particularly a large area substrate, without subjecting the substrate to numerous expensive and time-consuming processing steps.

I have discovered that explosive bonding provides a highly satisfactory solution to the above-described problems. The use of high explosives for metal-working purposes dates, of course, from the turn of the century; however, serious research into this subject matter was not begun until the late forties and early fifties. Initially, research was concentrated on the use of high explosives to shape massive workpieces which could not be conveniently or economically worked by any other technique. More recently, however, research has been concentrated on explosive welding; the aircraft and aerospace industries, in particular, being extremely active in this area, as explosive welding is highly attractive to these industries because of the exotic nature of the metals and alloys employed therein.

Explosive metal cladding has also proved extremely successful and is used, for example, to produce the blank cupro-nickel/copper stock used by the Government to mint U.S. currency.

When compared to the dimensions of typical substrates and electronic components, the workpieces which are welded or clad by prior art explosive techniques are truly massive. For example, a typical prior art application might be to explosively clad a layer of 14 guage titanium to the surface of a cylindrical pressure vessel, 15 feet in diameter by 30 feet long, and which is fabricated from 4 inch thick steel. As another example of the massive workpieces handled by the prior art, in the previously discussed explosive cladding of cupro-nickel/copper stock, a 10 foot by 20 foot sheet of cupro-nickel, 9/10ths of an inch thick, is explosively clad to a correspondingly dimensioned sheet of copper, 3 3/4 inches thick, which in turn is explosvely clad to a second 9/10ths inch thick sheet of cupro-nickel, to form the finished product.

By way of contrast, the miniature workpieces which are explosively bonded according to the methods of my invention are several magnitudes of order smaller. For example, a typical integrated circuit device may measure only 0.035 inch by 0.035 inch and the 16 or more beam leads to be bonded to the substrate are cantilevered outward from the device and may each measure only 0.0005 inch thick by 0.002 inch wide by 0.006 inch long. Further, typical ceramic or glass substrates may measure only 4 inch × 2 inch × 20 mils thick.

In prior art explosive bonding techniques, such as above described, the workpieces to be bonded are placed in proximity to each other and a sheet charge of high explosive, such as RDX (cyclotrimethylene trinitramine) is overlaid on the upper surface of one of the workpieces to be bonded. A commercial detonator is then implanted at one end of the sheet explosive, and ignited from a safe distance by means of an electrical spark. The detonator then explodes, setting off in turn an explosion in the sheet charge of RDX. The force created by this latter explosion accelerates the first workpiece towards the second workpiece to firmly bond them one to the other.

Because of the massive size of the workpieces used in the prior art, unwanted by-products of the explosion are not of particular concern; neither is contamination of the workpieces or damage to the workpiece surfaces. If a "clean" surface is required, the workpieces can easily be machined, sanded or buffed to the desired finish. Again by way of contrast, the miniature workpieces to be bonded by the methods of my invention, particularly electronic components such as integrated circuits, are extremely sensitive to contamination. Further, because of their extremely small size, buffing, sanding or polishing of these workpieces to smooth the surfaces thereof and remove impurities therefrom is impractical, if not impossible. In addition, substrates such as glass and ceramic are extremely brittle and tend to craze or crack when subjected to sudden concentrated stresses.

The use of a buffer layer which is positioned intermediate the sheet charge of explosive and the upper surface of one of the workpieces is known in the prior art. However, in the prior art this buffer layer is not provided for the purpose of (and indeed would be inoperative for) protecting the surfaces of the workpieces from chemical contamination or reducing stress concentrations in the workpieces. Rather, in the prior art, these buffer layers are provided to modify the characteristics of the secondary explosive material and, in particular, to reduce the velocity of detonation.

In the case of massive workpieces of the type bonded by prior art explosive bonding techniques, as much as several hundred pounds of explosive may be required. Obviously, the explosion must be performed out of doors, under the most carefully controlled safety conditions.

While the exact mechanism by which explosive bonds are formed with workpieces and explosive charges of this size is not fully known, through trial and error, certain formulas have been developed relating the quantity of explosive required to produce a satisfactory bond under given conditions and workpiece dimensions. These formulas are, for the most part empirically derived, and, therefore, do not yield satisfactory results when applied to workpieces which are several orders of magnitude smaller.

An explosive may be defined as a chemical substance which undergoes a rapid chemical reaction, during which large quantities of gaseous by-products and much heat are generated. There are many such chemical compounds and, for convenience, they are divided into two main groups: low explosive, such as gun powder; and high explosives. The latter category may be further subdivided into initiating (or primary) explosives and secondary explosives. Primary explosives are highly sensitive chemical compounds which may easily be detonated by the application of heat, light, pressure, etc. thereto. Examples of primary explosives are the azides and the fulminates. Secondary explosives, on the other hand, generate more energy than primary explosves, when detonated, but are quite stable and relatively insensitive to heat, light, or pressure. In the prior art, primary explosives are used exclusively to initiate detonation in the higher energy, secondary explosives.

Strictly speaking, the difference between a low explosve, such as gun powder, and a high explosve, such as TNT, is in the manner in which the chemical reaction occurs. The fundamental difference is between burning (or deflagration) and detonation, not between the explosive substances themselves. It is quite common to find that an explosive can either deflagrate or detonate according to the method of initiation or the quantity of explosive involved. If the mass of explosive matter is small, thermal ingition thereof, as by an open flame, usually, if not always, leads to deflagration; but if the mass exceeds a certain critical value, it is possible for the burning to become so rapid that it sets up a shock-wave front in the explosive material and detonation ensues. The critical mass varies from explosive to explosive, thus, for the primary explosive lead azide, the critical mass is too small to measure, whereas for TNT it is in the order of 2,000 pounds. Thus, the application of an open flame to a mass of TNT of, say, 1,800 pounds would not produce detonation but only deflagration. The application of the same open flame to 2,200 pounds of TNT, however, would produce an immediate detonation. Quantities of secondary explosive, therefore, which are smaller than the critical mass must be detonated by an intense shock, e.g., from the detonation of a primary explosive such as lead azide and are thus of no value for the bonding of miniature workpieces.

Prior to my invention, then, primary explosives were used exclusively for initiating detonation in secondary explosives such as TNT, dynamite and the like. Because the critical mass of such primary explosives is so small as to be unmeasurable, the empirical equations developed for the use of subcritical masses of secondary explosives are inapplicable. This is primarily due to the difference in the parameters, such as the detonation velocity, of the highly sensitive primary explosves, and the relatively insensitive secondary explosives. The detonation velocity of the primary explosive mercury fulminate, for example, is approximately 2,000 meters per second, whereas the detonation velocities of the secondary explosives TNT and nitroglycerin are approximately 6,000 meters per second and 8,000 meters per second, respectively. A more detailed discussion of the thermochemistry of explosives may be found in the publications entitled, "Detonation in Condensed Explosives," by J. Taylor, published by Oxford University Press, London, 1952 and "Explosive Working of Metals," by J. S. Rinehart and J. Pearson, published by Macmillan, New York, 1963.

SUMMARY OF THE INVENTION

Briefly, my invention comprises, in a first preferred embodiment, a method of bonding a first workpiece to a second workpiece. The method comprises the steps of: placing said first and second workpieces in juxtaposition to each other; and detonating a primary explosive in the region of the desired bond, the force created by the detonation of said primary explosive accelerating at least one of said workpieces towards the other, to thereby form an explosive bond between said workpieces.

Detonation of the explosive material is accomplished, in one embodiment of the invention, by applying heat to the workpiece. In other embodiments of the invention, detonation is accomplished by the application of light, laser, or acoustic energy to the explosive material. In still further embodiments of the invention, detonation is accomplished by means of alpha particles, shock waves, mechanical pressure, an electron beam, alternating magnetic or electric fields, an electric discharge or the provision (or removal) of a chemical atmosphere. In some embodiments of the invention, the bonding force is applied directly to the microcircuits to be bonded; in other embodiments, the bonding force is applied through a protective bonding medium.

Another embodiment of my invention comprises a method of bonding the microleads of at least one beam lead-like device to corresponding regions of a workpiece. The method comprises the steps of placing a charge of explosive material proximate each of the microleads to be bonded in a position to accelerate the microleads towards the workpiece and detonating the explosive material to explosively bond the microleads to corresponding regions of the workpiece. As before, the explosive material may be detonated by heat, light, sound, pressure, etc. and may be applied directly to the workpiece or through a protective buffer medium, such as stainless steel or a polyimide, such as KAPTON.

DETAILED DESCRIPTION OF THE INVENTION

Figure 1:
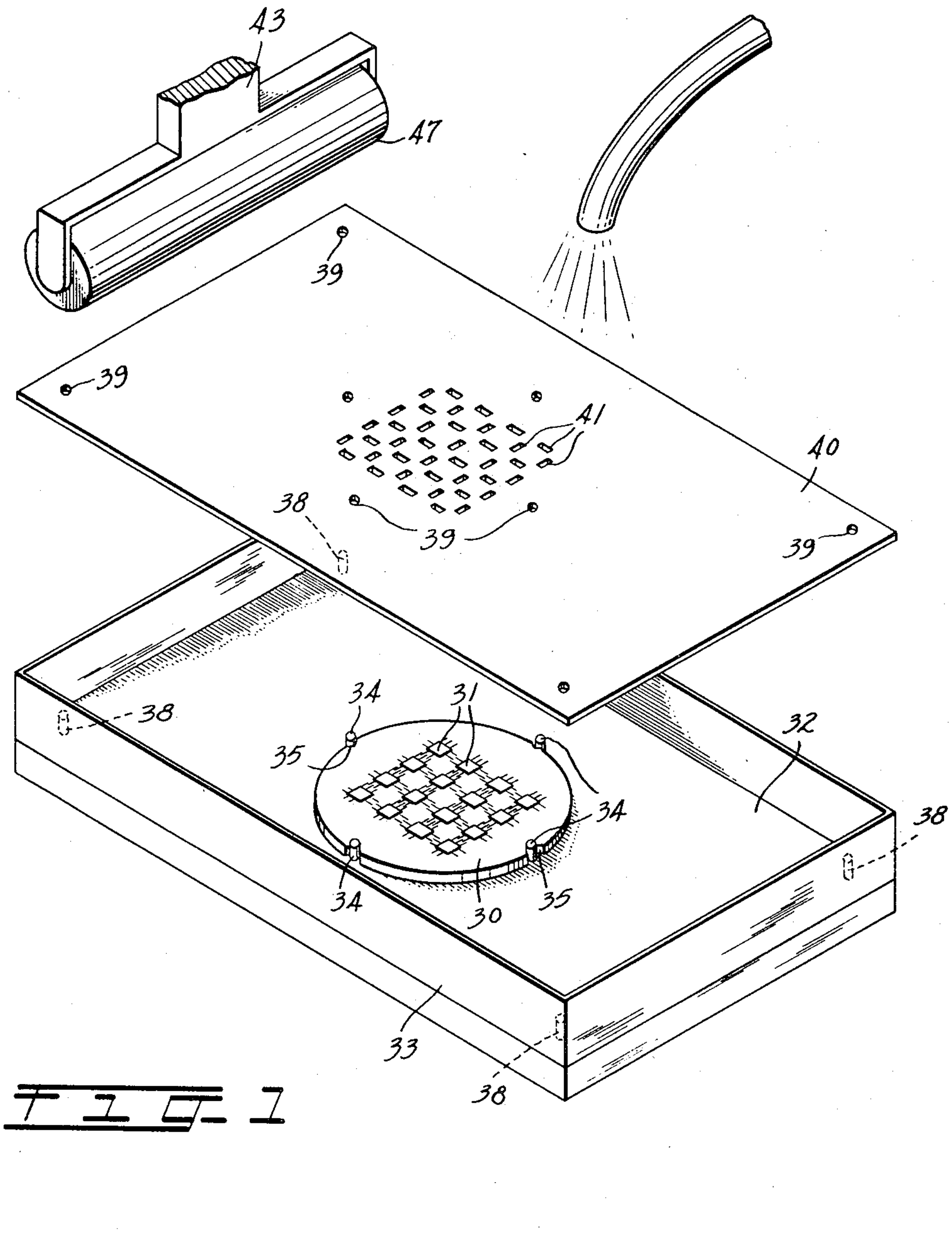
FIG. 1 is an isometric view of an apparatus which may be utilized to deposit explosive material on the micro-leads of a beam lead-like device.

FIG. 1 depicts an apparatus which may be used to deposit a small quantity of explosive material on the microleads of a beam-leaded IC device, or the like. As shown, a conventional wax-coated semiconductor carrier plate 30, having a plurality of beam-leaded IC devices 31, temporarily secured thereto, is placed on the bottom surface 32 of a hollow, rectangular container 33. Carrier plate 30 is restrained from movement, and aligned, by means of a plurality of first registration pins 34 which mate with a corresponding plurality of notches 35 in carrier plate 30. A second plurality of registration pins 38 are provided at the four corners of container 33. A rectangular stencil plate 40, having a plurality of orthogonally oriented slot apertures 41 therein, is adapted to fit down inside container 33 so that registration pins 34 and 38 mate with a corresponding plurality of apertures 39 in the stencil plate. When so mated, the slot apertures 41 align with the beam leads of the IC devices 31.

Figure 2:
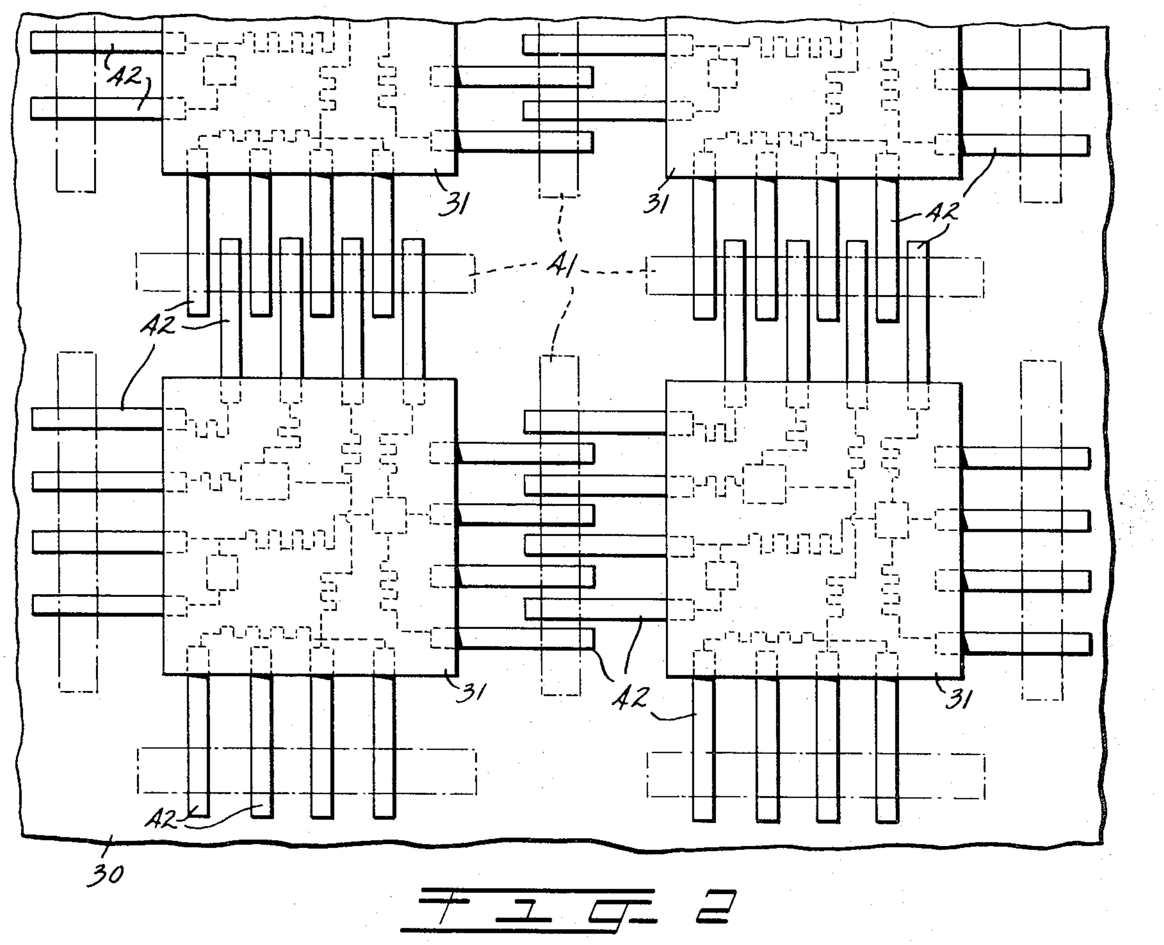
FIG. 2 is a partial top view of a plurality of beam-lead devices, prior to separation, and shows in greater detail the manner in which the explosive material is deposited thereon.

Referring now to FIG. 2, as is well known, each of the beam-leaded IC devices 31 is provided with a plurality of gold beam leads 42 cantilevered outward therefrom. In accordance with standard manufacturing techniques for these devices, prior to separation, the beam leads of each device are interdigitated with the beam leads of its immediate neighbors. Registration pins 34 and 38, FIG. 1, align plate 40 so that the slot apertures 41 therein are positioned intermediate each pair of beam-lead devices and cross the interdigitated beam leads 42, FIG. 2, in the region of overlap.

Returning to FIG. 1, a squeegee 43 having a rubber roller 47 is slideably mounted in a frame (not shown) which in turn is attached to the walls of container 33. The rubber roller 47 is adapted to fit within container 33 and to engage the upper surface of stencil plate 40 when the plate is mated with registration pins 34 and 38 and positioned over IC carrier plate 30.

In operation, the carrier plate, bearing the IC devices whose beam leads are to be coated with explosive material, is placed on the bottom surface 32 of container 33 and aligned therewith by means of registration pins 34. Next, stencil plate 40 is fitted over the aligned carrier plate 30 and a metered quantity of explosive material deposited from a suitable container onto the stencil plate. Squeegee 43 is then lowered into engagement with the stencil plate and rolled back and forth to force the explosive material down into slotted apertures 41 and, hence, onto the beam leads of each IC device. When the metered quantity of explosive material has been consumed, the stencil plate and the carrier are removed from container 33 and the explosive material permitted to dry. The individual IC devices are then separated from the carrier by any of several conventional techniques.

It is, of course, necessary to select an explosive which is not so sensitive that the squeegee operation will cause premature detonation thereof. Typically, the explosive material is dissolved in some suitable chemical solution which facilitates the stenciling of the explosive onto the IC device. In addition, the solvent may inhibit premature detonation, at least until the solution has evaporated and the explosive material is dry.

It will be appreciated that a suitably patterned silk-screen (or other equivalent screening device) could be substituted for stencil plate 40. Other analogous printing techniques may, of course, also be used to apply the explosive to the workpiece. It will further be appreciated that this technique for depositing a patterned charge of explosive material onto a workpiece to be explosively bonded is not necessarily restricted to miniature workpieces, such as IC devices or to substrates. The technique may be used, for example, on much larger workpieces. Indeed, a patterned charge of a conventional, secondary explosive may also be deposited on a workpiece by this technique, provided that the secondary explosive is dissolved in some suitable vehicle to render it sufficiently mobile to pass through the apertures of a stencil or a screen. In this latter event, the stencil plate or silk-screen could be re-used to screen-on the necessary charge of primary explosive required to detonate the secondary explosive.

Figure 3:
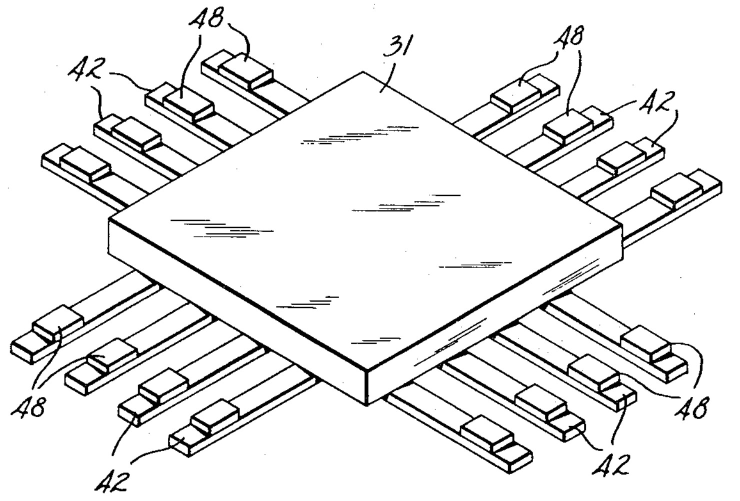
FIG. 3 is an isometric view of a single beam-lead device and shows the location of the explosive material on the microleads thereof in greater detail.

FIG. 3 illustrates the appearance of a beam-lead device after it has been coated with explosive material and separated from its neighboring devices. As can be seen, a small quantity of explosive material 48 has been deposited on each beam lead 42. It will be apparent that the quantity of explosive deposited, and hence the bonding force produced when the explosive is detonated, may be controlled by varying the width of the apertures in the stencil plate and/or by altering the thickness of the stencil plate, thereby affecting the amount (i.e., width and height) of explosive material deposited on the beam leads.

For some special applications, it may be desirable to deposit unequal amounts of explosive material on each beam lead. The above-described apparatus can easily accommodate this requirement by a combination of the above-described changes to the apertures of the stencil plate. Further, the apparatus may easily be adapted to handle different IC circuit configurations, or different substrate arrangements, by merely substituting an appropriately configured stencil plate. The apparatus can also handle an individual IC device, if so desired, by the use of a suitably dimensioned holder for the individual device. Advantageously, slotted apertures 41 in stencil 40 are arranged to deposit explosive material onto each beam lead no closer to the main part of the device than 1/3 of the length of the beam lead and no further from the device than 2/3 of the length of the beam lead. Advantageously, the average distance used in practice is approximately one-half of the length of a beam lead.

As previously discussed, in the bonding of miniature workpieces, the conventional use of a secondary high explosive, which is detonated by means of a detonator, is impossible. I have discovered, however, that primary explosives may be used to bond such miniature workpieces. Of the many known primary explosives, the azides and the fulminates are proabably the most widely understood, although many other chemical compounds exhibit similar characteristics and may also be used for the explosive bonding of miniature workpieces. The choice of the particular primary explosive to be used in any given bonding application is a function of the amount of explosive force required and/or the manner in which it is desired to initiate detonation. Advantageously, the detonation of the primary explosive, in accordance with my invention, may be accomplished by the application of heat, light, sound, pressure, shock waves and the introduction (or removal) of a suitable chemical atmosphere. For example, if light is employed as the detonating mechanism, then silver nitride ($Ag_3N$) or cuprous azide ($Cu(N_3)_2$) may be used as the primary explosive. Alternatively, if detonation is accomplished by means of mechanical force and pressure, mercury fulminate ($C_2N_2$ $O_2Hg$) or lead azide ($Pb(N_3)_2$) may be used as the primary explosive.

Table A, below, lists some of the more common azide compounds, together with their critical detonation temperatures.

TABLE A

THE MORE COMMON AZIDE EXPLOSIVES

| Compound | Formula | Critical Detonation Temp. °C. |
|---|---|---|
| Lead Azide | $Pb(N_3)_2$ | 350 |
| Silver Azide | $Ag(N_3)_2$ | 300 |
| Titanium Azide | $Ti N_3$ | 350 |
| Boron Azide | $B(N_3)_2$ | |
| Silicon Azide | $Si(N_3)_4$ | |
| Mercuric Azide | $Hg(N_3)_2$ | 460 |
| Copper Azide | $Cu(N_3)_2$ | 215 |
| Cadmium Azide | $Cd(N_3)_2$ | 144 |
| Ammonium Azide | $NH_4(N_3)$ | 170 |
| Mercurous Azide | $Hg_2(N_3)_2$ | 210 |

Table B, below, lists some of the more common fulminate compounds, together with their critical detonation temperatures.

TABLE B

THE MORE COMMON FULMINATE EXPLOSIVES

| Compound | Formula | Critical Detonation Temp. °C. |
|---|---|---|
| Mercury Fulminate | $Hg(ONC)_2$ | 190 |
| Silver Fulminate | $Ag(ONC)_2$ | 170 |
| Copper Fulminate | $Cu(ONC)_2$ | |

Table C, below, lists some additional primary explosive compounds, together with their critical detonation temperatures.

TABLE C

MISCELLANEOUS PRIMARY EXPLOSIVES

| Compound | Formula | Critical Detonation Temp. °C. |
|---|---|---|
| Mercuric Acetylide | $HgC_2$ | 260 |
| Mercurous Acetylide | $Hg_2C_2$ | 280 |
| Copper Acetylide | $CuC_2$ | 280 |
| Silver Acetylide | $Ag_2C_2$ | 200 |
| Lead Styphnate | $C_6H_3N_3O_9Pb$ | 295 |
| Barium Styphnate | $C_6H_3N_3O_9Ba$ | 285 |
| Silver Nitride | $Ag_3N$ | 155 |
| Tetrazene | | 200 |
| Diazodinitrophenol (DDNP) | $HOC_6H_3(NO_2)_2N(:N)$ | 180 |

The above three tables are by no means all inclusive. There are many other unstable chemical compounds which may be classified as primary explosives and which, under appropriate conditions of temperature and pressure, might conceivably be utilized for the explosive bonding of miniature workpieces. However, the explosives listed in the above tables are of primary interest in this regard.

Figure 4:
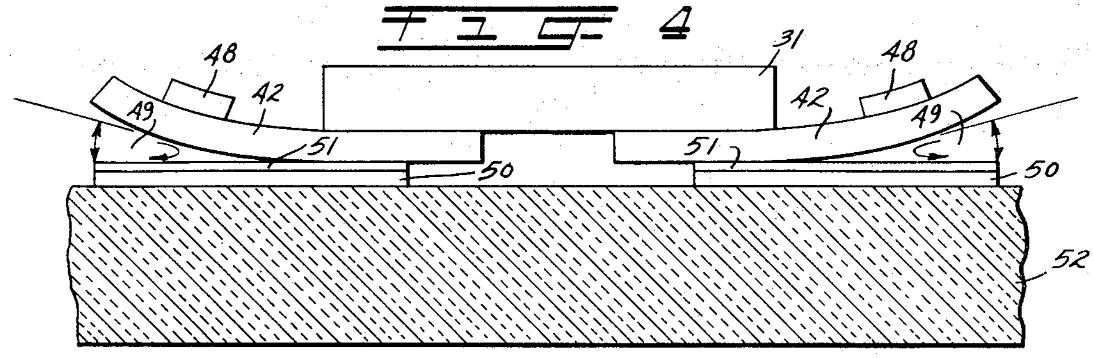
FIG. 4 is a partial, cross-sectional view of a beam-lead device prior to the explosive bonding thereof to the land areas of a substrate.

Turning now to FIG. 4, there is shown a cross-sectional view of integrated circuit device 31 prior to its being bonded to the terminal land areas 50 of a ceramic substrate 52. A thin film 51 of grease, dirt, metal oxide, or other contaminants is shown on the upper surface of land areas 50. A similar film will generally also be present on the surface of beam leads 42 but, for the sake of clarity, this film has been omitted from the drawing.

It will be noted that each beam lead is bent upward away from the substrate to form a small angle $\alpha$ with the plane of the substrate. In order for a bond to form between a beam lead and the corresponding land area of the substrate, the explosive charge 48, when detonated, must accelerate the beam lead downward towards the land area with a sufficiently high impact velocity that the resultant impact pressure is of sufficient magnitude to cause substantial plastic flow of the workpieces to be joined. Thus, the yield points of the materials from which the workpieces are fabricated must be considerably exceeded by the impact pressure.

An important aspect of explosive bonding is the phenomenon known as "jetting," that is, the process of material flow which occurs when two metal workpieces strike each other at sufficiently high impact velocity to cause plastic flow of the workpiece metals and the formation of a re-entrant "jet" of material between the workpieces, as shown by the arrows 49 in FIG. 4. The formation of this "jet" of molten material is important to the establishment of a strong bond, as it removes any impurities and oxides which may be present on the surfaces of the workpieces to be bonded and brings freshly exposed, virgin metal surfaces into intimate contact in the high-pressure collision. Notwithstanding the above, some workpiece materials, for example, gold, may be satisfactorily bonded even without the presence of "jetting." This is due to the inherently oxide-free surfaces of these materials. In that event, the angle which is formed between the beam lead and the substrate becomes less critical and in some instances even unimportant.

The impact pressure required to bond a beam lead to the corresponding substrate land area may be calculated from the shock Hugoniot data for the workpiece materials. Once the impact pressure required for bonding is known, the impact velocity may be calculated. This in turn yields the necessary ratio of accelerating explosive charge to metal mass (C/M), hence, the quantity of explosive material required for a given bonding operation.

The desirable jetting phenomenon, however, only occurs if the angle of impact, $\beta$, at the collision point exceeds a certain critical value. Further, there can exist either a stable jetting condition or an unstable jetting condition, the latter being undesirable as it results in a bond of poor quality.

Stable jetting will occur if the collision point at which the two surfaces first meet, travels along the interface with a velocity equal to or greater than the highest signal velocity in either of the two workpiece materials. Table D, below, lists the velocity of sound in several typical metals and, for comparison, Table E, lists the detonation velocity of several typical primary explosives.

TABLE D

Velocity of Sound in Several Typical Metals

| Metal | Velocity (m/sec) |
|---|---|
| Gold | 2030 |
| Silver | 2680 |
| Aluminum | 5000 |
| Platinum | 2800 |

TABLE E

Detonation Velocity of Typical Primary Explosives

| Explosive | Detonation Velocity (m/sec) |
|---|---|
| Lead Azide | 4000 |
| Lead Styphnate | 5000 |
| Mercury Fulminate | 5050 |
| DDNP | 6800 |

If the two workpieces to be bonded are positioned parallel to one another, the collision point velocity equals the detonation velocity of the accelerating explosive charge. It will thus be seen that for the types of metals commonly used for microleads and land areas in the electronics industry, by the choice of an appropriate explosive material, the collision point velocity will always exceed the bulk sonic velocity in the workpiece metals.

Actually, if the collison point velocity substantially exceeds the bulk sonic velocity in the workpiece materials, another undesirable effect is noted. That is, the generation of expansion waves in the workpieces which tend to separate the inner surfaces thereof and destroy or weaken the bond immediately after its formation. The ideal situation is when the collision point velocity slightly exceeds the bulk sonic velocity so that stable jetting occurs, yet undesirable expansion waves do not occur. For parallel geometry, this condition can be achieved by slowing down the detonation velocity of the explosive material, for example, by the addition of inert materials such as liquid paraffin or French Chalk thereto, or by reducing the density of the explosive. For example, the addition of 30 percent liquid paraffin to lead azide will reduce the velocity of detonation from 4,000 m/sec to 500 m/sec, but the mixing process is difficult to control and the results are often unpredictable. For these reasons, other means must be employed to reduce the collision point velocity.

If the workpieces to be bonded are not held parallel, but rather are aligned so that they make a small angle $\alpha$ to one another, the collision point velocity is no longer the same as the detonation velocity of the explosive material, but falls to some fraction thereof. Thus, by varying the geometry of the bonding configuration, the collision point velocity may be adjusted so that it is only slightly more than the bulk sonic velocity in the workpiece materials, which is the optimum condition.

As previously discussed, there is a critical angle of contact $\beta$ for the collision below which jetting and satisfactory bonding usually will not occur. For parallel geometry, $\beta$ can be increased by increasing the ratio of explosive charge to mass (C/M). However, if this is attempted in nonparallel geometry, such as shown in FIG. 4, it is found that the collision point velocity also increases. There is thus an interaction between changing the impact angle $\beta$ so that it exceeds the critical angle below which jetting does not occur, and lowering the collision point velocity to approximately the bulk sonic velocity in the workpiece materials. Nevertheless, despite this interaction, for workpieces of the type shown in FIG. 4, and primary explosives of the types listed in Tables A, B, and C, there exists a broad range of orientations, charge densities, and explosive compounds which will simultaneously satisfy all these criteria and produce strong, sound bonds. As an example of a specific bond, which I have produced, according to the methods of this invention, a gold wire measuring 0.002 inch by 0.0005 inch was bonded to a gold-plated ceramic substrate by means of from 25 to 40$\mu$ grams of lead azide. Detonation was accomplished by an electrical discharge from a 3 volt D.C. source. The wire made an angle of less than 5° to the plane of the substrate. I further discovered that bonding was facilitated if the temperature of the substrate was raised to 175°C prior to passing the electrical discharge through the substrate.

Figure 5:
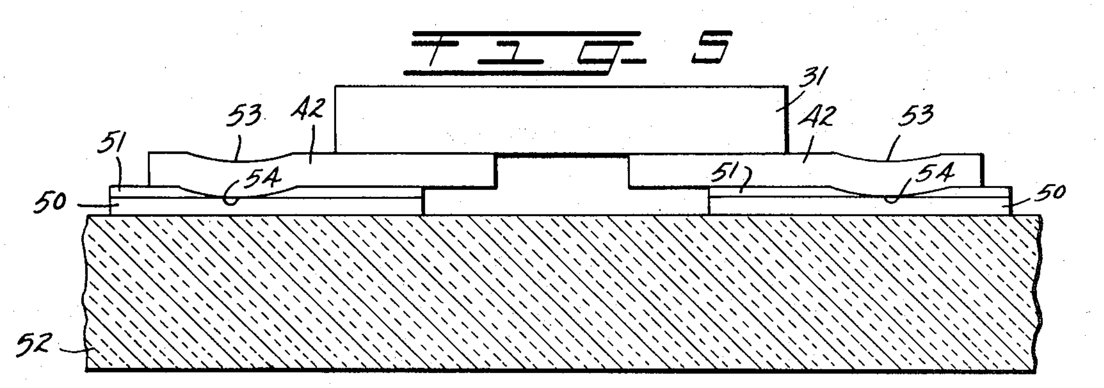
FIG. 5 is a partial, cross-sectional view of the beam-lead device shown in FIG. 4 after it has been explosively bonded to the substrate.

FIG. 5 depicts the beam-leaded device shown in FIG. 4 after it has been explosively bonded to the substrate. The beam leads 43 are now, of course, flattened and substantially parallel to the substrate. A small area of discoloration or pitting 53 will be noted on each beam lead in the region priorly occupied by explosive material 48. This discoloration and pitting, however, does not affect the mechanical strength or electrical characteristics of the beam leads to any detectable degree.

In the explosive bonding of massive workpieces, the explosive is laid down upon the upper surface of the upper workpiece as a sheet charge. In the methods of my invention, however, the explosive material is not laid down as a sheet charge, but rather as a point charge. Thus, the region 54 in which bonding actually occurs does not extend over the entire area of the beam lead. This is of no great import, however, as it approximates the geometry which occurs in other satisfactory bonding techniques, such as thermocompression or ultrasonic bonding.

As previously mentioned, because of the size of the workpieces and the extremely large quantities of explosive materials employed, conventional explosive bonding is usually performed out of doors. Thus, the unwanted by-products of the explosion are quickly discharged into the atmosphere. Further, in the prior art, the massive workpieces employed are not particularly sensitive to contamination by these by-products. This is not necessarily true, however, of the miniature workpieces contemplated by this invention, particularly integrated circuits and the like. Here, the by-products of the explosion, both gaseous and particulate, pose a very real threat of contamination to the silicon or germanium material from which the active devices in the integrated circuits are fabricated. This contamination may, under certain circumstances, alter the operating characteristics of the devices or, worse, render them totally inoperative. The same is true, to a lesser extent, of thin-film capacitors and resistors which may also be fabricated upon the same substrate. Fortunately, I have discovered that this contamination can, in part, be prevented by conducting the explosive bonding in a partial vacuum, for example, by the use of a conventional bell-shaped vacuum jar. In addition, by removing the air which is normally present between the workpieces, the partial vacuum tends to increase the workpiece acceleration, thereby improving the quality of the bond. As an alternative to the use of a partial vacuum, the explosive bonding may be effected through an intermediate buffer, such as a layer of plastic, for example the polyimide sold under the registered trademark "KAPTON," of the E. I. DuPont de Nemorus Co. Metallic material, for example, stainless steel, or the like, may also be used for the buffer medium.

Figure 6:
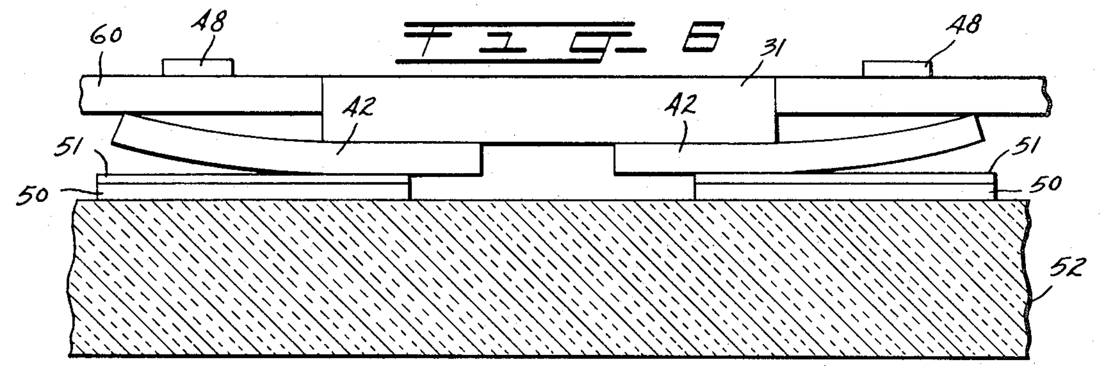
FIG. 6 is a partial, cross-sectional view of the beam-lead device shown in FIG. 4 illustrating the use of a buffer member positioned intermediate the explosive material and the beam-lead device.
Figure 7:
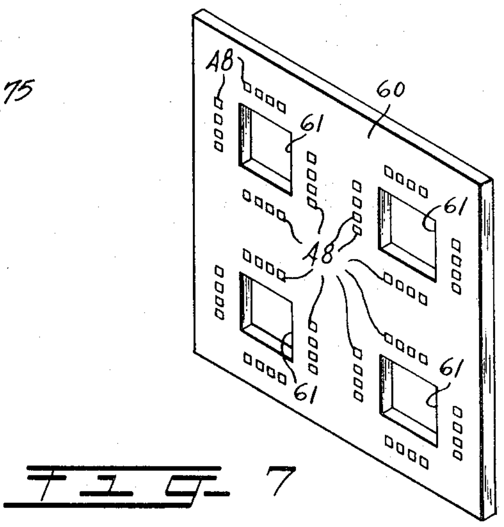
FIG. 7 is a plan view of the buffer member shown in FIG. 6 depicting the location of the explosive charges thereon in greater detail.

FIGS. 6 and 7 illustrate the use of such a buffer layer in an explosive bonding operation. As shown therein, a film of plastic (e.g., a KAPTON film 3 mils thick) or metallic material (e.g., 303 type stainless steel 2 mils thick) 60 having a plurality of apertures 61 therein is positioned over the top surface of beam-lead device 31. The explosive material 48, which priorly was deposited directly onto the beam leads 42, is now deposited on the upper surface of the film 60. Additionally, if film 60 is plastic and, in addition, transparent, alignment of the explosive charges, with respect to the beam leads of the integrated circuit devices, may be facilitated, for example, by use of the alignment technique disclosed in U.S. Pat. application, Ser. No. 820,179 of F. J. Jannett, filed on Apr. 29, 1969.

The explosive charges which are deposited onto the buffer film may be placed there by means of the apparatus illustrated in FIG. 1, or by the use of a patterned silk-screen or printed onto the film, intaglio fashion, by means of a suitable rubber or metallic roller having a raised surface thereon which corresponds to the desired locations of the explosive charges.

Figure 8:
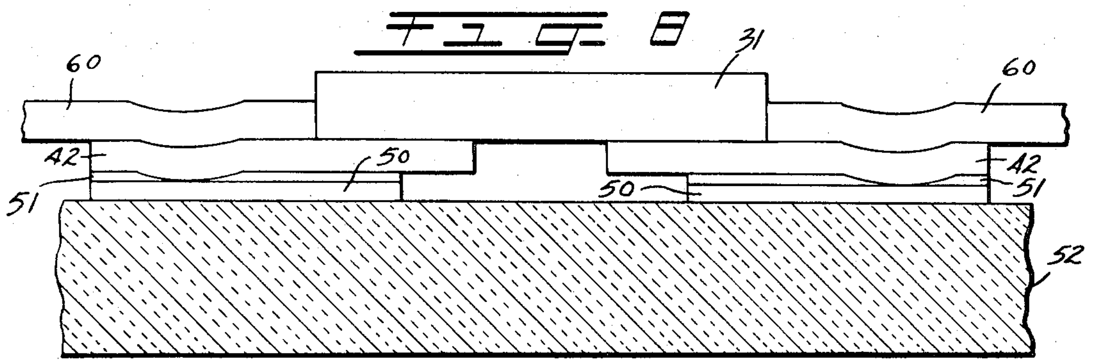
FIG. 8 is a partial, cross-sectional view of the beam-lead device shown in FIG. 6 after explosive bonding to the substrate has occurred.

FIG. 8 depicts the beam-lead device shown in FIG. 6 after the explosive material 48 has been detonated. As was the case illustrated in FIG. 5, the beam leads 42 are now substantially parallel to substrate 52 and bonded to the land areas 50 of the substrate at locations 54. The buffer film 60 is forced down about device 31 by the explosion, but is not ruptured. As a result, unwanted by-products of the explosion are prevented from reaching the sensitive portions of the substrate, and damage thereto is completely avoided. Although in FIG. 6 buffer sheet 60 is depicted as being apertured so that it may be fitted over the beam-lead devices, it will be appreciated that sheet 60 could be contoured, rather than apertured, and in that event would also serve to protect the IC device from contamination as well as the substrate. After the bonding operation has been satisfactorily performed, buffer film 60 may be peeled off the substrate. If the sheet is fabricated from plastic material, however, no deleterious effects will occur if it is permitted to remain in place.

As previously mentioned, the detonation of the primary explosive, in accordance with my invention, may advantageously be accomplished by exposure to light.

Table F, below, lists some of the primary explosive compounds exhibiting this property, together with he minimum light intensity required to initiate detonation thereof.

TABLE F

PHOTOSENSITIVE EXPLOSIVE COMPOUNDS

| Compound | Formula | Light Intensity in Joules Centimeter² |
|---|---|---|
| Silver Azide | $AgN_3$ | 2.6 |
| Silver Nitride | $Ag_3N$ | 0.2 |
| Silver Acetylide | $Ag_2C_2$ | 0.8 |
| Silver Fulminate | AgONC | 2.1 |
| Lead Azide | $Pb(N_3)_2$ | 2.0 |

The mechanism which renders these and other similar primary compounds sensitive to detonation by light is not fully understood. One theory is that the light is absorbed in a thin surface layer of the explosive material and within 50$\mu$ seconds is degraded into heat; the explosion is then believed to occur by a normal thermal mechanism. Another theory is that the explosion occurs as a result of a direct photochemical decomposition of the explosive matter. Regardless of the theory, however, these compounds may be detonated by the application of light thereto and are useful for the explosive bonding of miniature workpieces.

Figure 9:
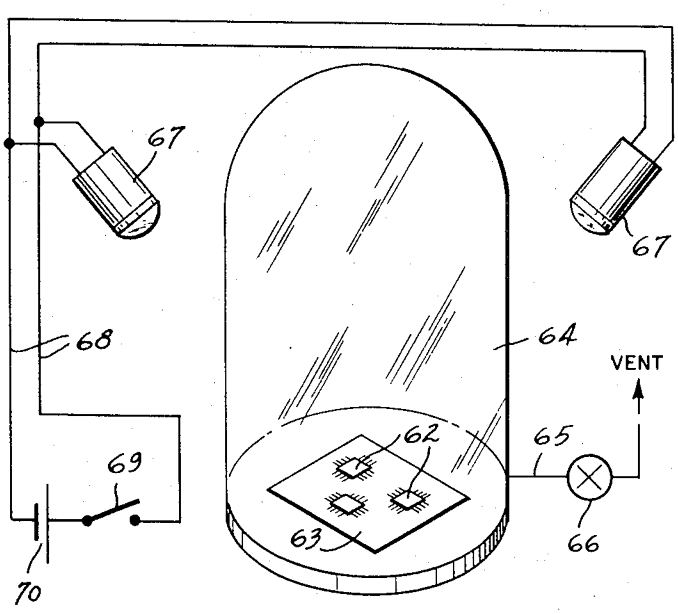
FIG. 9 is an isometric view of an apparatus for explosively bonding a plurality of beam-lead devices to a substrate by the application of light thereto.

FIG. 9 illustrates an apparatus which may be used to explosively bond the beam leads of an IC device using light as the detonating mechanism. It will be appreciated that this apparatus may also be used to bond other types of workpieces, for example, to explosively bond conductive metal paths onto a ceramic or glass substrate or to explosively bond the elements of capacitors, resistors, etc. to a substrate. The same is also true for the other apparatus discussed below with reference to FIGS. 10–18. The illustrative example of bonding the leads of an IC device to corresponding land areas on a substrate is not intended to be limiting and is only exemplary. The beam leads of the devices 62 to be bonded are coated with a quantity of light-sensitive primary explosive, for example, silver azide, and the devices then aligned with respect to the land areas of the substrate 63 in a conventional manner. If desired, the devices may be temporarily tacked to the substrate by means of a drop of alcohol, or the like. Substrate 63 is then placed within a glass vacuum jar 64, which is exhausted by means of an exhaust pipe 65 and a pump 66. One or more photo flash lamps 67, for example, krypton-filled quartz flash lamps are positioned outside the vacuum jar so that the light which is generated by the tubes will fall upon the photosensitive material on the beam leads. Clearly, vacuum jar 64 must be "transparent" to the light energy from lamp 67. The vacuum jar may thus be entirely fabricated from glass or quartz or have one or more glass or quartz windows set in the walls thereof. Photo flash lamps 67 are connected via a pair of conductors 68 to a switch 69, thence to a suitable source of energizing potential 70.

In operation, switch 69 is closed to complete a circuit from source 70 to photo flash lamps 67. In a well-known manner, the lamps fire and generate an intense burst of light which passes through the walls or windows in vacuum jar 64, and strikes the silver azide on each beam lead, detonating it and explosively bonding each of the IC devices 62 to substrate 63.

Silver azide is primarily responsive to light in the ultraviolet range ($\lambda = 3500$ A units) and krypton-filled photo flash lamps of the type shown in FIG. 9 produce more than enough energy in this ultraviolet range to detonate photosensitive silver azide. The typical duration of the flash from photo flash lamps 67 is approximately 60$\mu$s and explosion of the silver azide usually occurs within 20$\mu$s thereafter. From Table F the critical light intensity required to detonate silver azide is 2.6 joules/cm² which corresponds to $8 \times 10^{-4}$ calories/mm². This critical light intensity is independent of the mass of explosive material used, at least in the range of from 200 to 1,500 micrograms. Unwanted by-products of the explosion are, as previously discussed, vented from vacuum jar 64 by pump 66. However, in applications where these by-products are not troublesome, the bonding process can, of course, be conducted in a normal atmosphere. The use of a transparent plastic film positioned over the IC devices for alignment purposes is, of course, possible, provided that the intensity of the photo flash is sufficient to compensate for any light energy lost in passing through the transparent film. Further, this method of detonation may also be used with an explosively coated transparent buffer member positioned over the IC device and the substrate.

If the intensity of light from photo flash lamps 67 is not sufficient, additional lamps may be provided or a simple lens system (not shown) may be placed in front of each lamp to focus the light energy therefrom and thereby increase the light intensity above that critical value needed to detonate the explosive.

Figure 10:
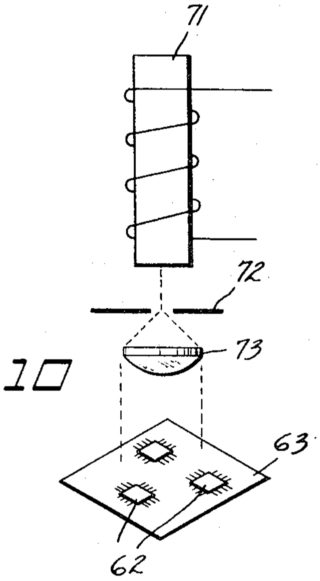
FIG. 10 is a partially illustrative, partially schematic diagram depicting the use of light from an optical maser to detonate the explosive material.

I have also discovered that a laser beam may be used to detonate the light-sensitive explosive, rather than the photo flash lamp illustrated in FIG. 9. As shown in FIG. 10, light from a pulsed or Q-switched laser 71 is expanded by a pinhole beam expander 72 and collimated by a lens 73. The colimated beam of laser energy is then directed upon the IC devices 62 on substrate 63 detonating the silver azide, or other photosensitive primary explosive, deposited on the beam leads thereof. Again, the substrate and IC devices could be positioned within a transparent vacuum jar, if desired, and the laser energy applied through the walls of the far to detonate the photosensitive explosive material.

Contrary to what might be expected, the amount of light energy required to initiate detonation of a photosensitive explosive varies inversely with the duration of the flash. Thus, a longer flash, as might be obtained, for example, from a magnesium-filled flash bulb, would have to be several times as intense to produce detonation of the same explosive material. Further, due to thermal lag, if the duration of the flash is too great, the explosive material will deflagrate rather than detonate, regardless of the intensity. Thus, the use of pulsed light sources is, generally speaking, preferable to the use of a continuous light source.

Figure 11:
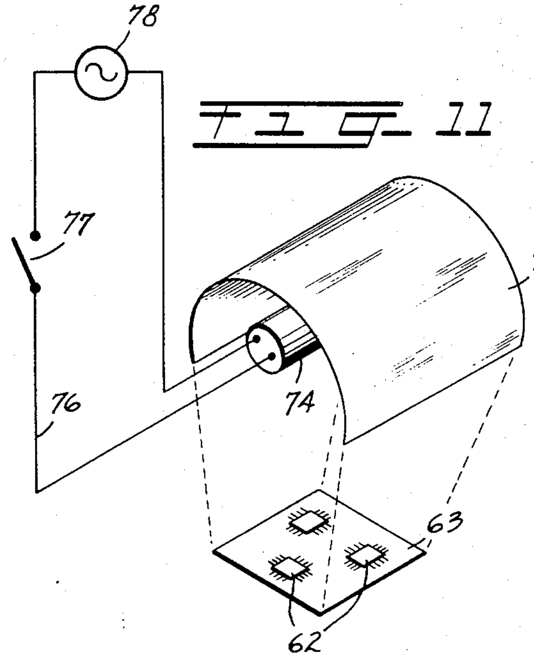
FIG. 11 is an isometric view of an apparatus for explosively bonding a plurality of beam-lead devices to a substrate by the use of focused light from an incandescent lamp.

FIG. 11 illustrates the use of a conventional light source to explosively bond a plurality of beam devices to a substrate. As shown, a quartz incandescent lamp 74 is positioned at the focus of an ellipsoidal reflector 75. The filament of lamp 74 is connected by a circuit 76 and a switch 77 to a suitable source of energizing potential 78. When switch 77 is closed and lamp 74 energized, the focused light therefrom impinges upon the surface of substrate 63 and detonates the photosensitive explosive deposited on the beam leads of the integrated circuits to be bonded.

Actually, because of the intense heat which is generated by quartz incandescent lamps of this type, which, may be rated at as much as 5 kilowatts, it is difficult to say whether it is the light energy or the thermal energy from the lamp which initiates the explosion. As with the previous examples, the substrate and the IC devices may be placed within a glass or quartz vacuum jar and the light from the incandescent lamp focused through the transparent walls of the vacuum jar. This, of course, provides protection from contamination by unwanted by-products of the explosion.

I have discovered that in the explosive bonding methods according to this invention the threshold sensitivity of certain photosensitive explosives may be lowered by the addition of other elements thereto. For example, by mixing approximately 28 percent by weight gold powder with the silver azide powder, the minimum light energy required to induce detonation of the mixture is significantly reduced.

In any application employing photosensitive explosives, it is necessary to apply the explosive to the beam leads of the devices to be bonded in total darkness, or at least at levels of illumination which are sufficiently low that there is no danger of premature detonation of the explosive.

Advantageously, the detonation of the primary explosive, in accordance with my invention, may be accomplished chemically. Thus, if the substrate and the beam-lead devices which are to be bonded thereto are placed within a container, for example, a vacuum jar, and a suitable chemical atmosphere allowed to flow over the substrate, the reaction which occurs between the primary explosive and the chemical atmosphere will initiate detonation of the explosive and bonding will occur.

Other primary explosives are inhibited from explosion by the presence of an appropriate chemical atmosphere. For example, the detonation of nitrogen iodide ($Ni_3.NH_3$) is inhibited by the presence of ammonia ($NH_3$) or water vapor. Thus, if the primary explosive is applied to the beam leads of an IC device in the presence of such an inhibitory atmosphere, detonation and bonding may be accomplished, after the device has been properly positioned over the land areas of a substrate, by exhausting the inhibitory atmosphere. In either of the above cases, care must be taken that the chemical atmosphere does not deleteriously affect the IC devices or the substrates.

Figure 12:
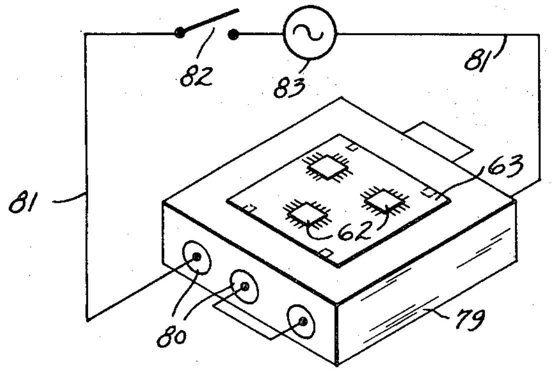
FIG. 12 is an isometric view of an apparatus which may be used to explosively bond a plurality of beam-lead devices to the land areas of a substrate by the application of heat thereto.

I have also discovered that the explosive bonding of miniature workpieces may be effected by the use of primary explosives which are detonated by other means. FIG. 12, for example, illustrates a method of explosively bonding a plurality of IC devices to a substrate by the application of heat to the bottom surface of the substrate. As shown, substrate 63, with a plurality of IC devices 62 temporarily tacked thereto, is placed upon the surface of a flat metal susceptor 79. A plurality of cartridge-type heaters 80 are mounted within the body of susceptor 79 and connected via a circuit 81 and a switch 82 to a suitable source of potential 83. When switch 82 is closed, the cartridge heaters rapidly increase the temperature of the susceptor, and hence the substrate, so that when the critical detonation temperature of the explosive material deposited on the beam leads is reached, the explosive detonates to explosively bond the IC devices to the substrate. Again, to prevent deflagration of the explosive material, the thermal inertia of the system must be kept as low as possible.

As can be seen from Tables A, B, and C, above, the critical detonation temperature of primary explosives of the type contemplated for use with my invention ranges from about 150°C to over 400°C, with most compounds detonating in the range of from 280°C to 300°C. The maximum temperature to which an integrated circuit device may be safely raised is in the order of 350°C, although this may be exceeded for short time intervals, without damage to the device. It will be evident that since the critical detonation temperature of most primary explosives is well below the maximum safe temperature for the IC device, detonation of the explosive material by the direct application of heat to the substrate poses no real danger to the characteristics and operability of the IC devices fabricated thereon. The heat required to initiate detonation may be applied to the substrate by means other than thermal induction from a heated susceptor. Referring back to FIG. 11, if quartz lamp 74 is replaced by an infrared source, the focused radiant energy therefrom will rapidly raise the temperature of the substrate above the critical detonation temperature and explosive bonding will again occur. As previously, the radiant energy from lamp 74 may be applied through the walls of a glass vacuum jar, if it is desired to conduct the explosive bonding in a partial vacuum.

Figure 13:
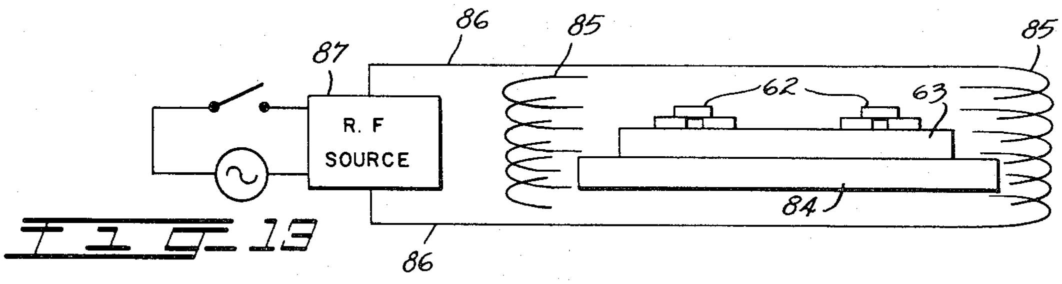
FIG. 13 is a side view of an apparatus which may be used to bond a plurality of beam-lead devices to the land areas of a substrate by the use of radio frequency induction heating.

FIG. 13 illustrates another technique which I have discovered may be used to raise the temperature of a device to initiate detonation of the explosive material deposited on the beam leads thereof. As shown, substrate 63 with beam-lead devices 62 temporarily tacked thereto is placed upon a suitable, non-metallic support member 84. An induction coil 85 surrounds support member 84 and is connected via a pair of conductors 86 to a source of radio frequency energy 87. When source 87 is energized, a radio frequency current flows through the windings of coil 85 and eddy currents are induced in all of the metallic portions of the substrate and the IC devices. These eddy currents rapidly raise the temperature of the beam leads above the critical detonation temperature of the explosive compound deposited thereon, so that the explosive compound detonates, bonding the devices to the substrate.

Figure 14:
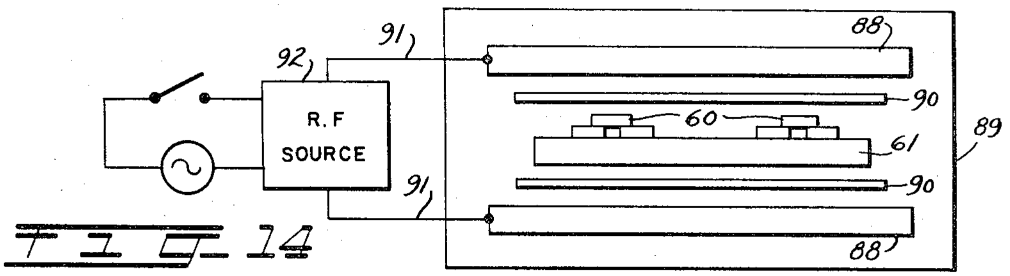
FIG. 14 is a side view of an apparatus which may be used to bond a plurality of beam-lead devices to the land areas of a substrate by the use of radio frequency dielectric heating.

FIG. 14 illustrates the analogous use of dielectric heating, rather than induction heating, to raise the temperature of the substrate. As shown, substrate 63, with the IC device 62 to be bonded thereto, is placed between the capacitor plates 88 of a dielectric oven 89. A sheet of plastic material 90 may be placed between the substrate 63 and each plate 88 to prevent physical damage to the IC devices, and the substrate, during the bonding process. Plates 88 are connected via circuit 91 to a radio frequency source 92 which, when energized, supplies a high-frequency alternating current to capacitor plates 88. The rapidly alternating electric field which is generated between plates 88 will induce hysteresis excursions in the nonconducting ceramic substrate, which excursions will rapidly raise the temperature of the substate, and hence the beam leads, above the critical detonation temperature of the explosive material on the beam leads. It is not entirely clear if the explosive compound is heated directly by the hystersis losses or by thermal conduction from the heated substrate, but in any event, the net effect is to detonate the explosive and bond each of the beam leads to the substrate.

Figure 15:
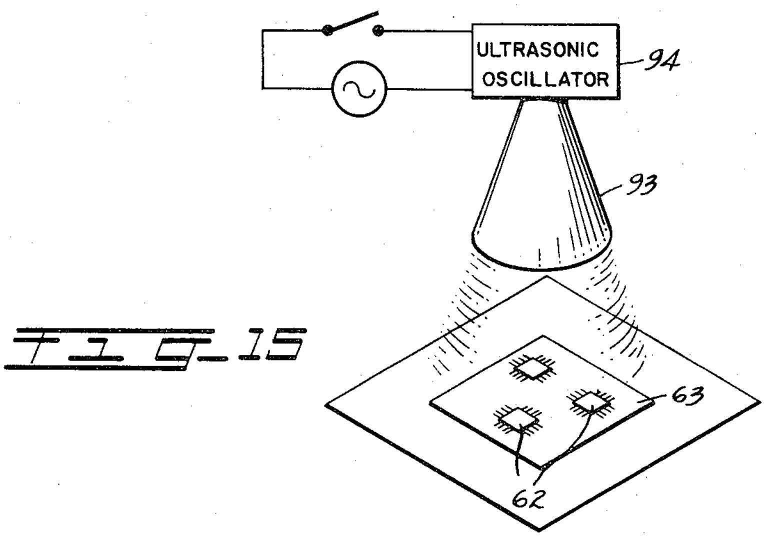
FIG. 15 is an isometric view of an apparatus which may be used to bond a plurality of beam-lead devices to the land areas of a substrate by the use of acoustical energy.

Advantageously, the detonation of the primary explosive, in accordance with my invention, may be accomplished by the application of mechanical shock or vibration to the explosive. For example, acoustic energy may be employed to detonate the explosive material. Referring to FIG. 15, the substrate, and IC devices to be bonded, are positioned beneath the outlet end of an acoustical horn 93 which is coupled to an ultrasonic oscillator 94. When energized, ultrasonic oscillator 94 generates ultrasonic waves which are propagated by horn 93 into the atmosphere. The acoustic waves from horn 93 stike the surface of the substrate, as well as the explosive material present on the beam leads of the IC devices to be bonded thereto, and, if the energy level of ultrasonic oscillator 94 is sufficiently high, shock waves are induced in the explosive material which are of susfficient magnitude to detonate the explosive material and bond the devices to the substrate. In this instance, it is not possible to conduct the bonding operation in a vacuum, as sound waves are not propagated in a vacuum. However, essentially the same degree of protection from unwanted by-products of the explosion may be obtained by flowing an inert gas, such as helium, through the vacuum jar during the bonding process so that unwanted by-products of the explosion are vented by the flow of inert gas. Subsonic and sonic waves may also be utilized to detonate the explosive material, although the use of ultrasonic energy is preferred as it requires less energy from the transducer and is easier to direct onto the substrate.

Figure 16:
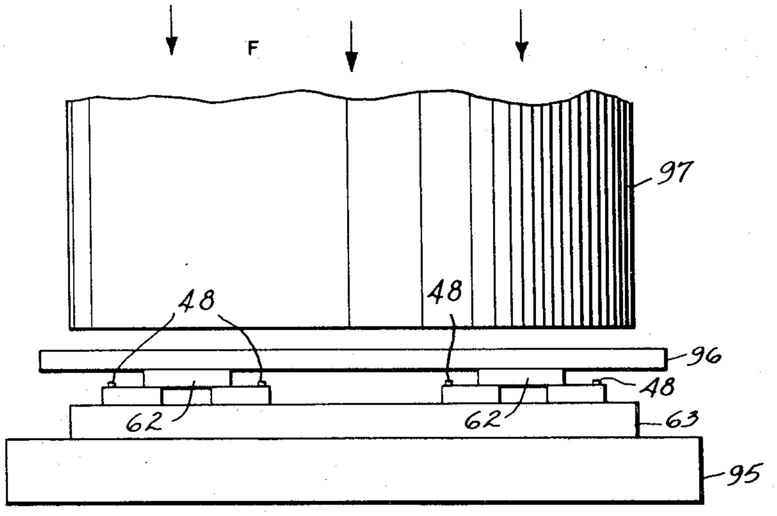
FIG. 16 is a side view of an apparatus which may be used to bond a plurality of beam-lead devices to the land areas of a substrate by the use of a simple mechanical pressure applied through a compliant medium.

FIG. 16 illustrates yet another method which I have discovered may be used to mechanically detonate the primary explosive on the beam leads of each device. As shown, a substrate 63, to which plurality of IC devices 62 are to be bonded, is placed upon a support bed 95 and a sheet of compliant material 96, for example, KAPTON or 2024 aluminum over-laid thereon. A contoured bonding tool 97 (or a flat bonding tool with a fluid pressure transmitting medium attached thereto) is then forced down into engagement with the compliant sheet to deform the sheet about the IC devices. As the sheet deforms about the IC devices, it contacts the beam leads thereof, detonating the explosive material 48 which is deposited thereon, thereby bonding the IC devices to the substrate.

In addition to transmitting mechanical pressure from the bonding tool to each of the beam leads, the compliant sheet also acts to constrain the upward forces of the explosions thereby increasing the bonding pressure which is applied to the beam leads. To a certain extent, the compliant member also inhibits contamination of the IC devices and the substrates, but not, of course, to the same extent as would be the case illustrated in FIG. 6, where the explosive material is applied to the upper surface of the buffer member rather than to the beam leads themselves.

The apparatus shown in FIG. 16 must be distinguished from the apparatus disclosed in the above-identified patent application of A. Coucoulas, Ser. No. 651,411. As disclosed in that application, the force which is applied to the compliant member actually creates the bonds between the beam leads and substrate; and this force, therefore, must be considerably greater than the force which is applied by the apparatus shown in FIG. 16, which need only be sufficient to detonate the primary explosive.

I have also discovered that explosive bonding of miniature workpieces can be accomplished by the use of primary explosives, for example, copper acetylide, lead styphnate, lead azide, mercury fulminate and tetrazine, which are detonated by an electrical discharge. The minimum spark energy necessary for detonation of these explosives varies from a low of 20 ergs for copper acetylide to more than 100,000 ergs for mercury fulminate. The minimum energy required is also a function of impurities present in the explosive material.

Figure 17:
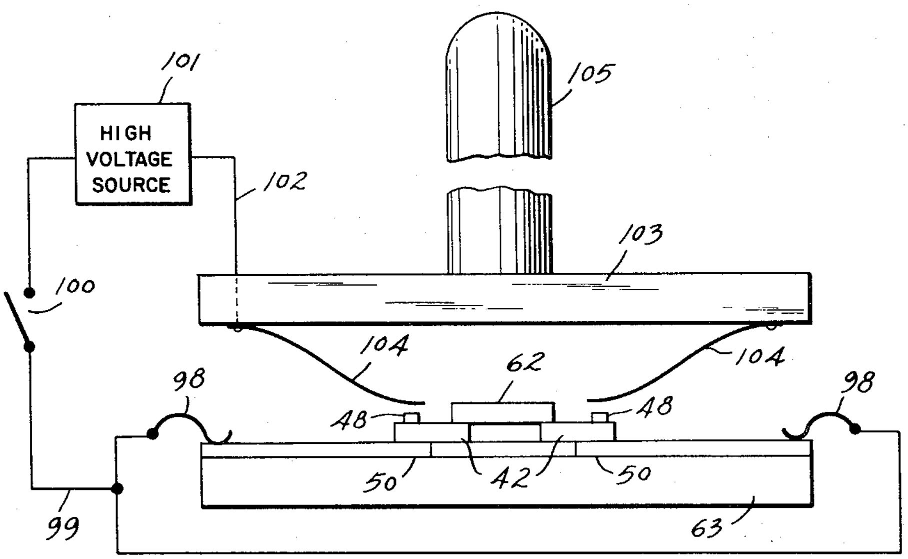
FIG. 17 is a side view of an apparatus which may be used to bond a plurality of beam-lead devices to the land areas of a substrate by means of an electrical discharge passing through the explosive material on the beam leads.

FIG. 17 illustrates a method in which an electrical discharge is utilized to initiate detonation of the primary explosive. As shown, an IC device 62, which is to be bonded to a substrate 63, is aligned over the land areas 50 of the substrate and temporarily tacked thereto in a conventional manner. A plurality of spring leaf contacts 98 are pressed into engagement with the terminal land areas 50, or other contact points, of the substrate. Contacts 98 are connected via a lead 99 and switch 100 to one terminal of a high-voltage source 101. The other terminal of source 101 is connected via a lead 102 to a metallic plate 103 to which a plurality of second spring leaf contacts 104 are riveted. Contacts 104 are positioned on plate 103 so that when plate 103 is lowered, by means of an insulated handle 105, into engagement with device 62, each one of the plurality of contacts 104 engages the explosive material 48, which is deposited on the corresponding one of the plurality of beam leads 42.

Since device 62 is not yet permanently bonded to substrate 63, there will be an imperfect electric contact between each beam lead 42 and the corresponding land area 50 of the substrate. For example, dirt, grease, metal oxide and other contaminants may be present on the surfaces of the connection, so that the unbonded resistance of the connection is typically several hundred ohms, or greater. However, if the potential of source 101 is made sufficiently high, the electric field developed across the interface of the connection will break down at least a portion of the nonconducting film, and cause a momentary spark. This momentary spark, however, is more than adequate to detonate the primary explosive 48 on each beam lead thereby forming a permanent bond between each beam lead and the corresponding land area of the substrate.

I have also discovered that explosive bonding of miniature workpieces may be accomplished by the use of primary explosives which are detonated by radiant energy. Lead and silver azide, for example, may be detonated by the use of an electron beam and nitrogen iodide may be detonated by means of gamma rays and neutron bombardment.

Figure 18:
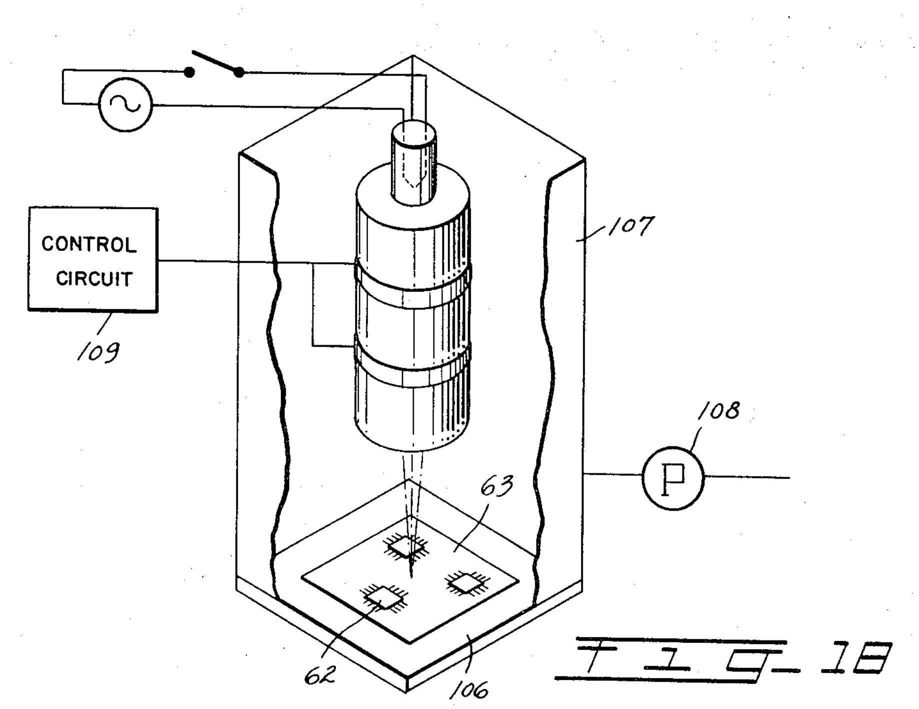
FIG. 18 is an isometric view of an apparatus which may be used to bond a plurality of beam-lead devices to the land areas of a substrate by means of a beam of electrons.

FIG. 18 illustrates an apparatus which may be utilized to explosively bond a plurality of beam-lead integrated circuits by the use of an electron beam. As shown, the integrated circuit device 62 to be bonded are aligned with respect to a substrate 63 and temporarily secured thereto. The substrate is then placed upon the objective stage 106 of an electron beam machine 107. The vacuum chamber of the electron beam machine is then evacuated by means of a pump 108 and the electron beam gun activated. A control circuit 109, which may be connected, for example, to a suitably programmed general purpose digital computer (not shown), successively deflects the electron beam to the approximate location of each beam lead on the substrate. As the electron beam strikes each charge of explosive material it detonates it, thereby explosively bonding the device to the substrate. Since the electron beam is not used to create the bond, per se, but only to detonate the explosive charge on the beam leads, it need not be of a particularly high intensity, and thus the electron beam can be defocused into a relatively broad beam. This eliminates most of the registration problems inherent with the use of an apparatus of this type.

I have discovered that in some instances a combination of more than one of the above-described detonation techniques facilitates the bonding operation. For example, where the primary explosive is to be detonated by the passage of an electric current therethrough, I have found that raising the temperature of the substrate prior to detonation reduces the amount of current required to produce detonation and results in a more reliable bond. Similarly, where the explosive mechanism is optical or acoustical, the application of heat to the substrate will also improve the quality of the bond.

The above-described methods of detonation assumed that the explosive material was deposited directly onto the beam leads of the device. However, one skilled in the art will appreciate that these methods are equally applicable to the situation where the explosive material is deposited onto the upper surface of a buffer member, such as a sheet of stainless steel, with the explosive bonding force being applied through the buffer sheet to the beam leads.

It must again be emphasized that all of the above-described detonation techniques may be used with workpieces othe than IC device. They may be used, for example, to explosively bond the electrode and counter electrode of a thick- or thin-film capacitor to a ceramic substrate. The same detonation techniques may also be used with more conventional metal cladding and metal working processes utilizing secondary explosives provided, of course, that an appropriate primary explosive is present to detonate the secondary explosive (the above-described detonation techniques, of courde, do not have sufficient energy to directly detonate the secondary explosive).

Figure 19A:
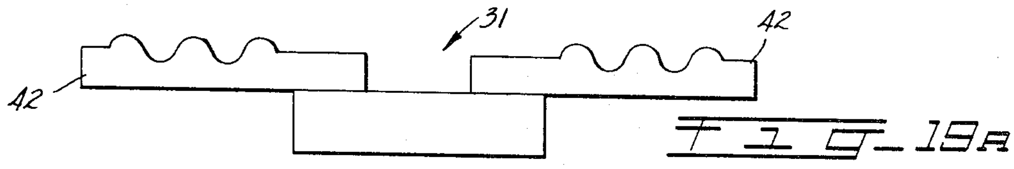
FIG. 19A is a cross-sectional view of a beam-lead device illustrating the manner in which the upper surface of the beam leads may be rendered undulating to improve the quality of the bond.
Figure 19B:
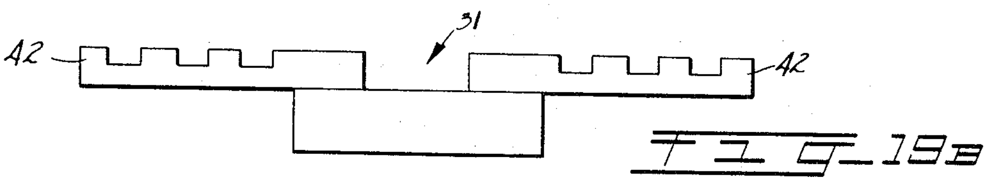
FIG. 19B is a similar cross-sectional view illustrating the manner in which the upper surface of the beam leads may be castellated to improve the quality of the bond.

Returning momentarily to FIG. 4, it will be recalled that each of the beam leads 42 of IC device 31 were bent upwards to form a small angle $\alpha$ with the plane of the substrate. This bending may be accomplished by any of several simple mechanical devices, as the beam leads are extremely thin and easily bent. FIGS. 19A and 19B, however, illustrate two alternate arragnements for the beam leads of IC device 31. In FIG. 19A, the beam leads are fabricated so that they have an undulating upper surface. In FIG. 19B, the beam leads are fabricated so that they have a castellated upper surface. The undulations and castellations may be effected, during fabrication of the beam leads, by the use of an appropriately exposed photo mask. In both instances, when the IC device is inverted over the land areas of the substrate to which it is to be bonded, and an explosive charge detonated proximate what is now the upper surface of the beam leads, there will be a plurality of air gaps separating the beam leads from the land areas of the substrate. Thus, portion of the beam leads are capable of being accelerated downward towards the substrate, as is required for explosive bonding to occur. If the beam leads are so patterned, it is not necessry to bend the beam leads upwards to form an angle $\alpha$ with respect of the plane of the substrate. This, of course, eliminates the slight risk of damage to the integrated circuit device which exists when the beam leads are so bent.

I have also discovered that, in some instances, neither beam lead bending nor castellation of the beam leads is necessary to obtain a good metal-to-metallized substrate bond. While this phenomenon is not fully understood, it is believed that the "hills" and "valleys" in substrate surfaces provide sufficient space through which the leads can accelerate to provide a high quality bond. This effect is more noticeable on ceramic substrates than glass substrates and is even more noticeable when an explosive bond is made directly between metal and bare ceramic, rather than between metal and metallized ceramic.

Figure 20:
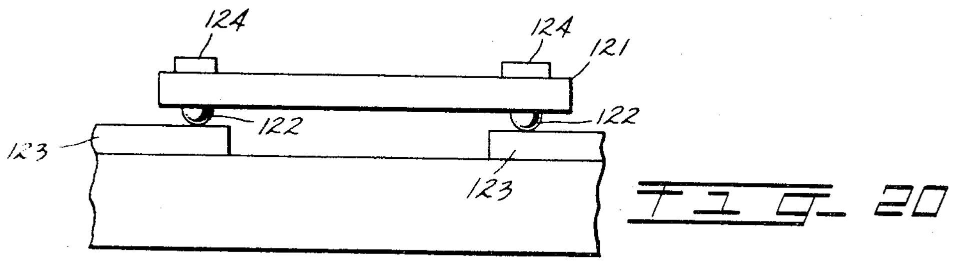
FIG. 20 is a partial, cross-sectional view illustrating the manner in which the contact pads of a "flip chip" IC devices may be explosively bonded to the land areas of a substrate.

Not all integrated circuits are provided with beam leads. FIG. 20 illustrates the so-called "flip chip," another widely used configuration. Here the integrated circuit 121 is provided with a plurality of contact pads 122 and, in the prior art, connection of the "flip chip" device to the outside world is accomplished by applying heat and pressure directly to the upper surface of the device by means of a suitably shaped bonding tool. The heat and pressure is transmitted through the device to the contact pads to bond the pads to the land areas 123 of the substrate.

It will be apparent that the methods and apparatus of my invention are adaptable for use with the "flip chip" as well as with many other integrated circuit configurations. One skilled in the art could readily adapt the teachings of this invention to handle the different bonding geometries which result when different IC device configurations are employed. In FIG. 20, for example, the explosive charges 124 are applied to the upper surface of "flip chip" device 121 so that they are located directly above the contact pads 122 on the bottom surface thereof. Thus, when detonated, the explosive charges 124 apply pressure, through the substrate, to the contact pads 122, bonding them to the land areas of the substrate.

A metallic (e.g., stainless steel) or plastic (e.g., KAPTON) buffer layer may also be used intermediate the explosive charge and the substrate. As in the example discussed with reference to FIG. 6, the buffer layer acts to cushion the force of the explosion and, in addition, inhibits contamination of the workpiece surfaces.

Figure 21:
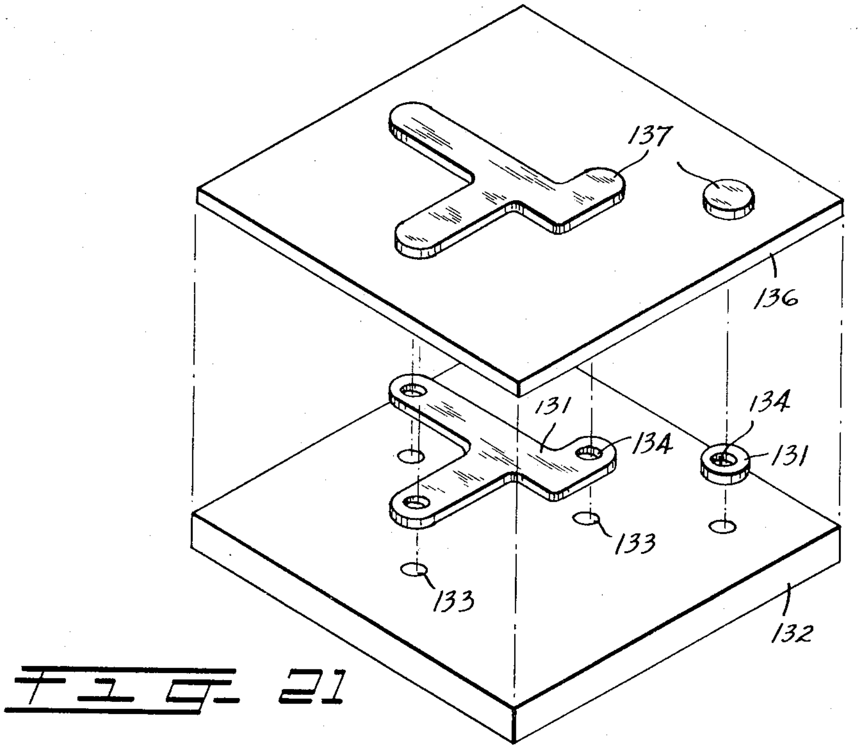
FIG. 21 illustrates an alternative embodiment of the invention which may advantageously be used to deposit conductive metal paths on an insulating substrate.

FIG. 21 illustrates yet another embodiment of my invention which may advantageously be used to fabricate "printed circuit" substrates, that is to say, substrates having a patterned arrangement of conductive metal paths arranged thereon in the well-known fashion. As shown in FIG. 21, a plurality of metallic elements (e.g., aluminum film) 131, are to be bonded to an insulating substrate 132 of aluminia or glass. Elements 131 may be shaped to the desired pattern by any of several known techniques, for example, by stampling the pattern from a continous roll of metallic tape by means of a cutting die, or the like. A plurality of appertures 133 are provided in substrate 132 and align with a corresponding plurality of apertures 134 in elements 131. These apertures are provided to receive the leads of electronic components when the finished substrate is utilized in a manufacturing process. Alternatively, apertures 133 may be drilled through the substrate after the elements 131 have been bonded thereto, in the well-known manner. A buffer medium of metallic or plastic material (e.g., KAPTON) 136, having a shaped charge of explosive material 137 deposited on the upper surface thereof, is positioned over the elements 131 and substrate 132.

In operation, the explosive charge 137 is detonated by any of the previously discussed detonation techniques and the explosive force which results forces the patterned metallic elements 131 down onto the substrate, thereby forming an explosive bond between each of the metallic elements 131 of the substrate. (For the sake of clarity, the various layers depicted in FIG. 21 are separated; in actual practice, however, the metallic elements, buffer medium, and substrate are placed in close proximity to each other, prior to detonation of the explosive material.) As previously stated, in most instances, it has not been found necessary to provide a gap between each metallic element 131 and the substrate 132, through which gap each element is accelerated to form the explosive bond. It is believed that the "hills" and "valleys" in the surface of the substrate provide sufficient space for the required acceleration to occur and it is for this reason that, in most cases, it has not been found necessary to provide spacing elements.

Buffer medium 136, in addition to providing a support mechanism for the shaped pattern of explosive charge 137, also acts to inhibit contamination of substrate 132 by by-products of the explosion. In addition, buffer medium 136 cushions the effect of the detonation and tends to reduce the creation of concentrated mechanical and thermal stresses in the workpiece, which, of course, is an important consideration in the case of fragile substrates, such as glass or ceramic.

Figure 22:
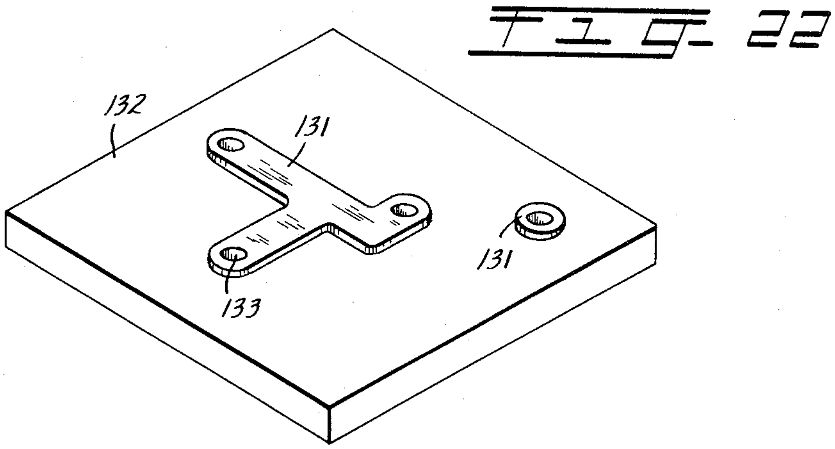
FIG. 22 illustrates the finished appearance of the apparatus shown in FIG. 21.

FIG. 22 illustrates the appearance of the substrate after metallic elements 131 have been explosively bonded thereto. It will be noted that the substrate is indistinguishable from a substrate product by one of the more conventional techniques (e.g., by metal deposition followed by a selective etch procedure), except that the insulation resistance of the substrate produced by my explosive bonding technique is somewhat superior, due to the absence of chemical residues of the etching solutions, photoresist, developers, etc.

Figure 23:
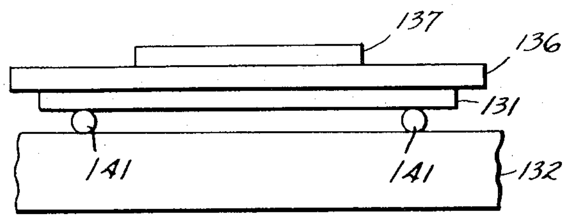
FIG. 23 is a side view of another embodiment of the invention in which spacing elements are provided intermediate the workpieces to be bonded to ensure the creation of a strong bond.

FIG. 23 illustrates yet another embodiment of my invention which may advantageously be employed if the surface of the substrate is highly polished so that the "hills" and "valleys " required for satisfactory bonding are not present. As shown, a pair of spacing elements, for example 0.004 inch diameter, gold or aluminum wire, are positioned intermediate substrate 132 and metallic element 131. Buffer sheet 136, with explosive charge 137 overlaid thereon, is then positioned adjacent metallic element 131 and the explosive charge detonated, as in the previous example. Spacing elements 141 ensure that a sufficient gap exists between substrate 132 and metallic element 131 so that an acceleration of element 131 towards substrate 132 occurs and a sound metal-to-ceramic bond is formed between the element and the substrate.

Figure 24:
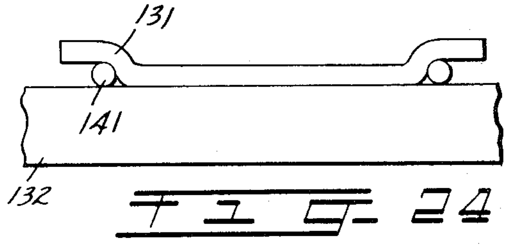
FIG. 24 is a side view of the elements depicted in FIG. 23 after an explosive bond has been formed.

FIG. 24 illustrates the appearance of the completed bond. Spacing elements 141, slightly flattened by the force of the explosion, may be removed from the bond area. Alternatively, the spacing elements may simply be left in place as, in general, they do not affect the operation of the completed circuit.

Figure 25:
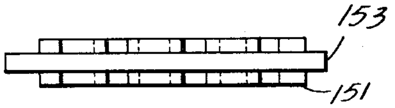
FIG. 25 is a side view of a buffer medium having a patterned workpiece fabricated on one side thereof and a correspondingly patterned explosive charge on the other surface thereof.
Figure 26:
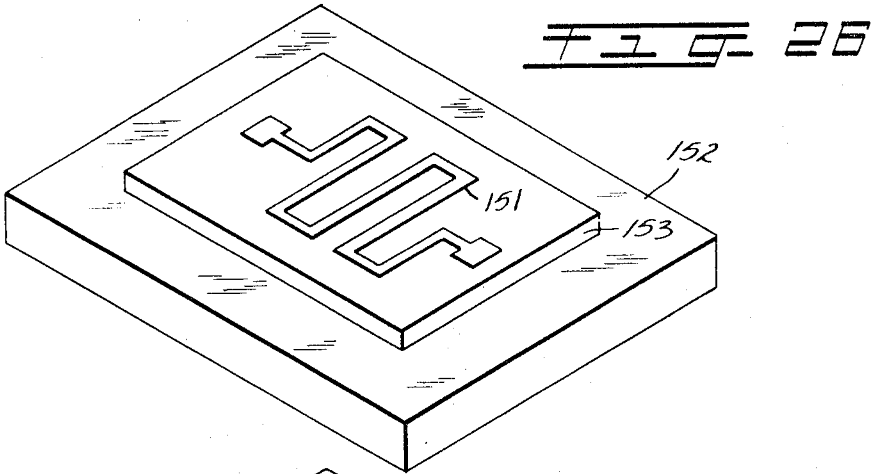
FIG. 26 is an isometric view of the buffer medium shown in FIG. 28 positioned over a substrate to which the metallic pattern is to be bonded.
Figure 27:
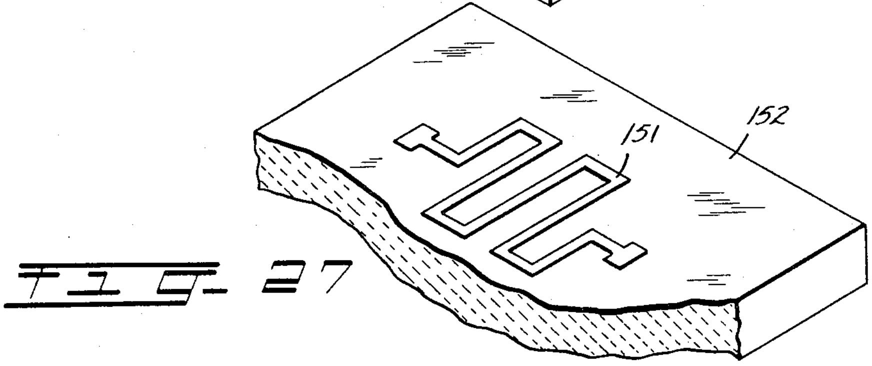
FIG. 27 is an isometric view of the apparatus shown in FIG. 26 after the explosive bond has been formed.

The techniques described with reference to FIGS. 21–24 may not be practical for all types of metallic film patterns. For example, some patterns of conductive metal film may be so complicated and intricate that they are not self-supporting or pose difficult alignment or orientation problems. Accordingly, FIGS. 25–27 illustrate yet another embodiment of my invention which overcomes this difficulty. The specific example is directed towards a thin- or thick-film resistor, but one skilled in the art will appreciate that this embodiment of the invention is not so limited and has general application to any explosive bonding process where at least one of the workpieces to be bonded is not self-supporting or needs careful alignment, e.g., the explosive bonding of indicia to the crown of a wrist watch. As shown in FIG. 25, a castellated pattern of conductive (actually resistive) metallic film 151 is to be explosively bonded to an insulating substrate 152. The metallic film 151 which is to be bonded to the substrate has priorly been fabricated, in a reverse image, on the bottom surface of buffer medium 153. Advantageously, buffer medium 153 comprises a polyimide film, such as KAPTON, and, in that event, the patterned layer of metallic film may be deposited thereon by the process disclosed in U.S. Pat. application, Ser. No. 719,976, filed Apr. 9, 1968 in the names of M. A. DeAngelo and D. J. Sharp, and which is assigned to the assignees of the instant invention. Other techniques for depositing the metallic film on the bottom surface of buffer member 153 may, of course, also be employed.

After metallic film 151 has been deposited on buffer medium 153, a correspondingly patterned charge of explosive material is stenciled, screened, or otherwise deposited on the upper surface of buffer medium 153. As shown in FIG. 26, the combined structure is then positioned over substrate 152 and the explosive material detonated, by any of previously discussed techniques, to explosively bond the intricately patterned conductive metal film 151 (which is now "right side up") onto the substrate. After detonation, the buffer medium is stripped away, leaving the finished product, as shown in FIG. 27. (The polyimide KAPTON is particularly good in this respect and is thus preferred for this embodiment.) As in the case discussed with reference to FIG. 24, spacing elements may be interposed between metallic film 151 and substrate 152, if necessary. Alternatively, as film 151 is deposited onto the bottom surface of buffer medium 153, portions of the film may be deliveratety made thicker than others to provide the necessary gap required for a good metal-to-ceramic bond.

In the embodiments of my invention illustrated in FIGS. 21–27, the explosive charge is depicted to be patterned to approximate the size and shape of the workpiece to be bonded. Strictly speaking, however, this is not an absolute requirement and the charge may assume a pattern somewhat smaller or somewhat larger than the actual outline of the workpiece. Indeed, the charge need not be patterned at all. All that is required is that a sufficiently large bonding force be created to accelerate the workpiece down onto the substrate.

FIGS. 28 through 31 illustrate yet another embodiment of my invention which may advantageously be used to manufacture thin- or thick-film capacitors on an insulating substrate, such as glass or ceramic. As is well known, in the prior art, such capacitors may be fabricated by sputtering, or vacuum depositing, an electrode onto the insulating substrate, either directly or through a selective masking and etching process, then oxidizing the upper surface of the electrode to form a nonconductive dielectric layer and finally depositing, or sputtering, a counter-electrode on top of the dielectric layer. According to my invention, any one, or all of the above steps may be performed by an explosive bonding technique.

Figure 28:
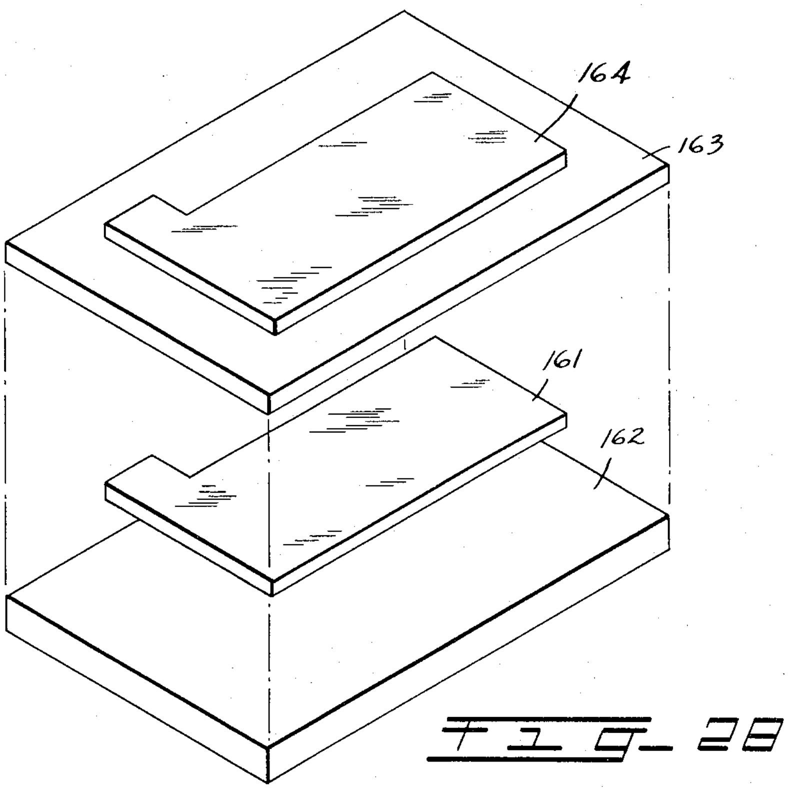
FIG. 28 illustrates yet another embodiment of the invention which may be used to manufacture thin or thick film capacitors by explosive bonding techniques.

As shown in FIG. 28, electrode 161 is bonded to ceramic substrate 162 by positioning the electrode over the substrate and then applying a buffer medium 163 over the electrode 161 and substrate 62. Buffer medium 163 may comprise a sheet of stainless steel of from two to three mils thickness or a sheet of polyimide plastic, such as KAPTON, of approximately the same thickness. A patterned charge of explosive material 164 is deposited on the upper surface of buffer medium 163 and, when detonated by any of the detonation techniques previously discussed, accelerates the electrode 161 down into the "hills" and "valleys" of the ceramic substrate 162, forming an explosive bond therebetween.

As with regard to the example illustrated in FIG. 23, spacing elements (not shown) may be interposed between electrode 161 and substrate 162, if the surface characteristics of the substrate are such that a good explosive bond cannot be formed without the use of such spacing elements. After the detonation has occurred, the buffer medium 163 may be stripped away, leaving electrode 161 firmly bonded to the substrate. As previously discussed, electrode 161 may be fabricated on the lower surface of buffer medium 163 by the technique taught in the above-reference patent application of M. A. DeAngelo-D. J. Sharp, Ser. No. 719,976.

Figure 29:
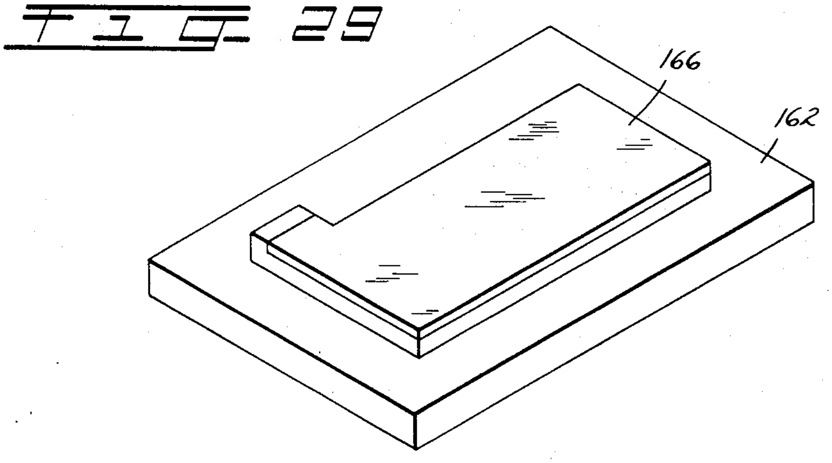
FIG. 29 illustrates the embodiment shown in FIG. 28 after the electrode of a capacitor has been explosively bonded to a substrate.

As shown in FIG. 29, the upper surface of electrode 161 may now be oxidized by any of several well-known techniques to form an insulating dielectric layer thereon. Alternatively, the previously discussed technique illustrated in FIG. 28 may be repeated to explosively bond an insulating dielectric layer to the electrode 161. Indeed, the buffer medium itself may be left in place for this purpose; however, the buffer medium may be too thick for most practical applications and, in that event, a thinner dielectric layer may be created on the lower surface of the buffer medium, explosively bonded to the electrode and the buffer medium stripped away, as previously discussed.

Figure 30:
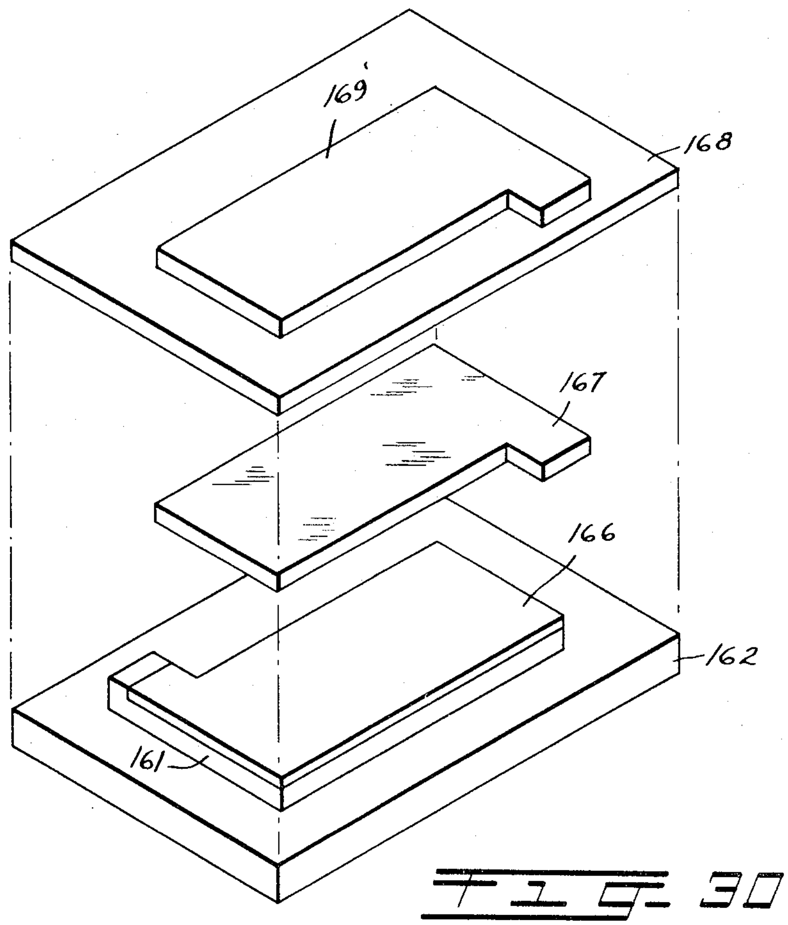
FIG. 30 is another view of the capacitor shown in FIG. 29 illustrating the manner in which a counter-electrode may be explosively bonded thereto.

As shown in FIG. 30, the technique used to bond the electrode may be reiterated to explosively bond a counter electrode to electrode 161 and dielectric layer 166. To that end, a counter electrode 167, which may be either self-supporting or formed on the lower surface of a second buffer medium 168, is positioned over, and aligned with respect to, electrode 161 and dielectric layer 166. The upper surface of buffer medium 168 is provided with a patterned explosive charge 169 and, when this charge is detonated, counter electrode 167 is accelerated towards electrode 161 and dielectric layer 166, forming an explosive bond therebetween.

Figure 31:
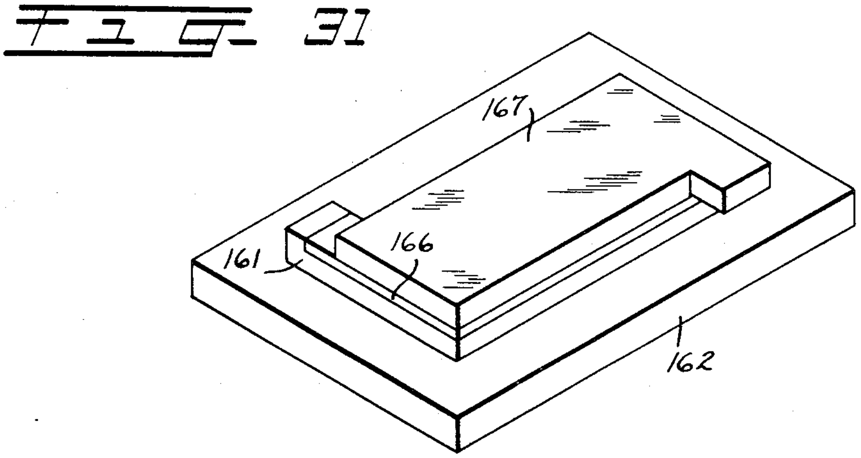
FIG. 31 is an isometric view of the capacitor shown in FIG. 30 after the counter-electrode has been explosively bonded thereto.

FIG. 31 illustrates the appearance of the finished product. It is, of course, feasible to fabricate the counter electrode by means other than explosive bonding, for example, by conventional sputtering or deposition procedures. Further, although FIGS. 28 and 30 indicate that the explosive charges 164 and 169 are patterned to correspond to the underlying electrode 161 and counter electrode 169, respectively, it will be appreciated that the explosive charges may have a shape which does not exactly correspond to the underlying electrode and counter electrode. The creation of a capacitor, or other electronic components, such as inductors, resistors, etc., by explosive bonding techniques may, of course, be coupled with the simultaneous deposition of conductive metallic paths on the same substrate. That is to say, a single large area, explosive bonding process may be used to simultaneously lay down thin-film resistors, the electrodes of thin-film capacitors, and the necessary conductive circuitry to interconnect these devices. One or two additional explosive bonding steps will bond the additional circuit elements required so that an entire operating package, including explosively bonded semiconductor device may be manufactured in only two or three processing steps, which contrasts to the dozens of steps which would be required to manufacture an equivalent package by conventional techniques.

While my invention has been disclosed in the context of the bonding of electronic components, such as integrated circuit devices, the methods and apparatus disclosed herein may be employed to bond other miniature workpieces, for example, those used in the watch making camera, aero-space and scientific industries. More specifically, my invention is of use in any application where it is desired to bond a first miniature workpiece to a second workpiece. One skilled in the art will appreciate that certain aspects of my invention are also of use in more conventional explosive bonding and metal working techniques which utilize both primary and secondary explosives.

It will also be apparent that one skilled in the art may make various changes and modifications to the methods and apparatus disclosed herein without departing from the spirit and scope of this invention.

What is claimed is:

1. A method of rendering the microleads of a beam lead-like device suitable for explosive bonding to corresponding regions of a workpiece, comprising the step of:

applying a primary explosive to at least one surface of at least one of said microleads.

2. The method according to claim 1 wherein said beam lead-like device is a beam-leaded semiconductor device.

3. The method according to claim 1 wherein said beam lead-like device is a beam-leaded integrated circuit device.

4. the method according to claim 2 wherein said primary explosive is applied no closer than $0.3l$ to, and no further than $0.7l$ from, the body of said beam-leaded semiconductor device, where $l$ represents the length of said microleads.

5. The method according to claim 3 wherein said primary explosive is applied no closer than $0.3l$ to, and no further than $0.7l$ from, the body of said beam-leaded integrated circuit device, where $l$ represents the length of said microleads.

6. A method of applying a charge of primary explosive material to the microleads of at least one beam lead-like device, comprising the steps of:

positioning a stencil plate over said at least one beam lead-like device, said stencil plate having a plurality of apertures therein corresponding in position to the microleads of said at least one beam lead-like device;

aligning said stencil plate with respect to said at least one beam lead-like device so that each of said apertures is positioned over a corresponding one of said microleads; and forcing primary explosive material through the apertures in said stencil plate and onto each of said microleads.

* * * * *

L-566-PT
(6-69)

UNITED STATES PATENT OFFICE
CERTIFICATE OF CORRECTION

Patent No. 3,765,938 Dated October 16, 1973

Inventor(s) BENJAMIN H. CRANSTON

It is certified that error appears in the above-identified patent and that said Letters Patent are hereby corrected as shown below:

In the Abstract, delete the existing Abstract, and substitute therefor, --This patent discloses several techniques for applying a primary explosive, such as lead azide, to the beam leads of an integrated circuit or the like. The beam leads are subsequently explosively bonded to the land areas of a substrate.--

In the specification, column 1, line 50, "method" should read --method of--; line 65, "problems" should read --problems,--. Column 3, line 26, "paraellelism" should read --parallelism--; lines 30-31, "paraellelism" should read --parallelism--; line 47, "parellelism" should read --parallelism--. Column 4, line 20, "explosvely" should read --explosively--. Column 5, line 29, "explosive" should read --explosives--; lines 37-38, "explosves" should read --explosives--; lines 42-43, "explosve" should read --explosive--; line 43, "explosve" should read --explosive--. Column 6, line 12, "explosves" should read --explosives--. Column 8, line 29, "FIG. 28" should read --FIG. 25--. Column 9, line 6, "plate" should read --stencil plate--. Column 11, Table C,

| | | | | |
|---|---|---|---|---|
| "$HgC_2$260 | | --$HgC_2$ | 260 |
| $Hg_2C_2$280 | | $Hg_2C_2$ | 280 |
| $CuC_2$280 | | $CuC_2$ | 280 |
| $Ag_2C_2$200 | should read | $Ag_2C_2$ | 200 |
| $C_6H_3N_3O_9$Pb295 | | $C_6H_3N_3O_9Pb$ | 295 |
| $C_6H_3N_3O_9$Ba285 | | $C_6H_3N_3O_9Ba$ | 285 |
| $Ag_3N$155" | | $Ag_3N$ | 155--. |

Column 13, line 52, "43" should read --42--. Column 16, line 50, "colimated" should read --collimated--; line 56, "far" should read --jar--. Column 19, line 30, "susfficient" should read --sufficient--. Column 21, line 44, "othe" should read --other--; same line, "device" should read --devices--; line 53, "courde" should read --course--;

L-566-PT
(6-69)

UNITED STATES PATENT OFFICE
CERTIFICATE OF CORRECTION

Patent No. 3,765,938 Dated October 16, 1973

Inventor(s) BENJAMIN H. CRANSTON

It is certified that error appears in the above-identified patent and that said Letters Patent are hereby corrected as shown below:

line 62, "arragnements" should read --arrangements--. Column 22, line 7, "portion" should read --portions--. Column 23, line 1, "stampling" should read --stamping--; line 3, "appertures" should read --apertures--. Column 24, line 46, "of" should read --of the--; line 59, "deliverately" should read --deliberately--. Column 25, line 21, "62" should read --162--.

In the claims, claim 4, column 26, line 60, "the" should read --The--.

Signed and sealed this 16th day of April 1974.

(SEAL)
Attest:

EDWARD M.FLETCHER,JR.
Attesting Officer

C. MARSHALL DANN
Commissioner of Patents